US012796269B2

(12) United States Patent
Zhang et al.

(10) Patent No.: US 12,796,269 B2
(45) Date of Patent: Nov. 10, 2026

(54) DISPLAY SUBSTRATE AND DISPLAY APPARATUS

(71) Applicant: BOE TECHNOLOGY GROUP CO., LTD., Beijing (CN)

(72) Inventors: Xiaojin Zhang, Beijing (CN); Haiyan Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 384 days.

(21) Appl. No.: 18/697,209

(22) PCT Filed: Sep. 13, 2022

(86) PCT No.: PCT/CN2022/118556
§ 371 (c)(1),
(2) Date: Mar. 29, 2024

(87) PCT Pub. No.: WO2024/007449
PCT Pub. Date: Jan. 11, 2024

(65) Prior Publication Data

US 2024/0407219 A1 Dec. 5, 2024

(30) Foreign Application Priority Data

Jul. 8, 2022 (CN) ......................... 202210798479.2

(51) Int. Cl.
*H01L 29/08* (2006.01)
*H10K 50/12* (2023.01)
(Continued)

(52) U.S. Cl.
CPC ........... *H10K 59/353* (2023.02); *H10K 50/12* (2023.02); *H10K 50/852* (2023.02); *H10K 59/32* (2023.02);
(Continued)

(58) Field of Classification Search
CPC ...... H10K 59/353; H10K 50/12; H10K 59/32; H10K 50/852; H10K 59/352;
(Continued)

(56) References Cited

U.S. PATENT DOCUMENTS

| | | | |
|---|---|---|---|
| 2005/0099118 | A1 | 5/2005 | Kobayashi |
| 2005/0225232 | A1 | 10/2005 | Boroson et al. |

(Continued)

FOREIGN PATENT DOCUMENTS

| | | | |
|---|---|---|---|
| CN | 101211960 | A | 7/2008 |
| CN | 101924123 | A | 12/2010 |

(Continued)

OTHER PUBLICATIONS

CN202210798416.7, Office Action, Aug. 12, 2022.

(Continued)

*Primary Examiner* — Niki H Nguyen
(74) *Attorney, Agent, or Firm* — The Webb Law Firm

(57) ABSTRACT

A display substrate includes a backplate, an anode layer, a first auxiliary layer, a second auxiliary layer, a third auxiliary layer, first light-emitting layers of at least two different colors between the first and second auxiliary layers, second light-emitting layers of at least two different colors between the second and third auxiliary layers, and a cathode layer. The first light-emitting layers at least include first blue light-emitting layers. The second light-emitting layers at least include second blue light-emitting layers. The first auxiliary layer includes film layers; and a portion, opposite to a first blue light-emitting layer, of the film layers has an optical thickness of $L_1$. The third auxiliary layer includes film layers stacked; and a portion, opposite to the first blue light-emitting layer, of the film layers has an optical thickness of $L_2$, where $L_1$ and $L_2$ satisfy the following formula:

$$|L_1 - L_2| \leq 20\pi + \frac{(k-1)\lambda_B}{2^{k-1}}$$

20 Claims, 10 Drawing Sheets

(51) Int. Cl.

| | |
|---|---|
| ***H10K 50/852*** | (2023.01) |
| ***H10K 59/32*** | (2023.01) |
| ***H10K 59/35*** | (2023.01) |
| ***H10K 59/38*** | (2023.01) |
| *H10K 101/20* | (2023.01) |

(52) U.S. Cl.
CPC ........... *H10K 59/352* (2023.02); *H10K 59/38* (2023.02); *H10K 2101/20* (2023.02)

(58) Field of Classification Search
CPC .. H10K 2101/20; H10K 59/35; H10K 59/122; H10K 59/80522; H10K 2102/351; H10K 59/876; H10K 50/11; H10K 50/824; H10K 59/123; H10K 59/80518; H10K 59/124; H10K 50/125; H10K 50/828; H10K 50/19; H10K 59/351; H10K 50/171; H10K 50/18; H10K 59/10; H10K 59/60; H10K 59/40; H10K 50/00; H10K 39/32; H10K 59/95; H10K 50/10; H10K 50/157; H10K 50/167; H10K 50/81; H10K 59/127; H10K 50/865; H10K 50/115; H10K 30/86; H10K 30/85; H10K 59/8723
See application file for complete search history.

(56) References Cited

U.S. PATENT DOCUMENTS

| | | | |
|---|---|---|---|
| 2005/0225233 | A1 | 10/2005 | Boroson et al. |
| 2005/0280008 | A1 | 12/2005 | Ricks et al. |
| 2011/0114969 | A1 | 5/2011 | Lee et al. |

FOREIGN PATENT DOCUMENTS

| | | | | | |
|---|---|---|---|---|---|
| CN | 102709477 | A | | 10/2012 | |
| CN | 103107288 | A | | 5/2013 | |
| CN | 104659067 | A | | 5/2015 | |
| CN | 106449714 | A | * | 2/2017 | ........... H10K 59/876 |
| CN | 106449715 | A | | 2/2017 | |
| CN | 106654049 | A | | 5/2017 | |
| CN | 106654050 | A | | 5/2017 | |
| CN | 106684113 | A | * | 5/2017 | ............. H10K 50/16 |
| CN | 106784363 | A | | 5/2017 | |
| CN | 106981504 | A | | 7/2017 | |
| CN | 108574052 | A | | 9/2018 | |
| CN | 108878504 | A | | 11/2018 | |
| CN | 109103236 | A | | 12/2018 | |
| CN | 110582862 | A | | 12/2019 | |
| CN | 210837760 | U | | 6/2020 | |
| CN | 111477758 | A | | 7/2020 | |
| CN | 111653679 | A | | 9/2020 | |
| CN | 111725290 | A | | 9/2020 | |
| CN | 112768613 | A | | 5/2021 | |
| CN | 113871431 | A | | 12/2021 | |
| CN | 114864839 | A | | 8/2022 | |
| CN | 114883508 | A | | 8/2022 | |
| JP | 2005100946 | A | | 4/2005 | |
| JP | 2010192427 | A | | 9/2010 | |
| KR | 101268532 | B1 | | 5/2013 | |
| KR | 20140062401 | A | * | 5/2014 | ............. H10K 50/16 |
| KR | 1020160013687 | A | | 2/2016 | |
| WO | 2018119965 | A1 | | 7/2018 | |

OTHER PUBLICATIONS

CN202210798479.2, Office Action, Aug. 16, 2022.
PCT/CN2022/118555, International Search Report, Apr. 7, 2023.
PCT/CN2022/118556, International Search Report, Mar. 13, 2023.

* cited by examiner

DISPLAY SUBSTRATE AND DISPLAY APPARATUS

CROSS-REFERENCE TO RELATED APPLICATIONS

This application is the United States national phase of International Patent Application No. PCT/CN2022/118556 filed Sep. 13, 2022, and claims priority to Chinese Patent Application No. 202210798479.2 filed Jul. 8, 2022, the disclosures of which are hereby incorporated by reference in their entireties.

BACKGROUND OF THE INVENTION

Field of the Invention

The present disclosure relates to the field of display technologies, and in particular, to a display substrate and a display apparatus.

Description OF Related Art

Organic light-emitting diode (OLED) display technology is a technology that utilizes a luminescent material to emit light driven by an electric current to realize display. OLED displays have the advantages of being ultra-light, ultra-thin, high brightness, large viewing angle, low voltage, low power consumption, fast response, high definition, vibration resistance, bendable, low cost, simple process, using less raw materials, high luminous efficiency and wide temperature range.

SUMMARY OF THE INVENTION

In an aspect, a display substrate is provided. The display substrate includes a backplate, an anode layer, a first auxiliary layer, a second auxiliary layer, a third auxiliary layer, and a cathode layer that are stacked on the backplate in sequence, a plurality of first light-emitting layers of at least two different colors provided between the first auxiliary layer and the second auxiliary layer, and a plurality of second light-emitting layers of at least two different colors provided between the second auxiliary layer and the third auxiliary layer. A micro cavity is formed between the anode layer and the cathode layer. The plurality of first light-emitting layers at least include a plurality of first blue light-emitting layers. The plurality of second light-emitting layers at least include a plurality of second blue light-emitting layers. The first auxiliary layer includes film layers stacked in sequence, a number of the film layers is a; and a portion, opposite to a first blue light-emitting layer, of the film layers with the number of a has an optical thickness of $L_1$, and $L_1$ satisfies:

$$L_1 = \sum_{h=1}^{a} n_h r_h;$$

where a is a positive integer, $n_h$ is a refractive index of an h-th film layer among the film layers with the number of a, and $r_h$ is a thickness of the h-th film layer.

The third auxiliary layer includes film layers stacked in sequence, a number of the film layers is b; and a portion, opposite to the first blue light-emitting layer, of the film layers with the number of b has an optical thickness of $L_2$, and $L_2$ satisfies:

$$L_2 = \sum_{i=1}^{b} n_i r_i;$$

where b is a positive integer, $n_i$ is a refractive index of an i-th film layer among the film layers with the number of b, and $r_i$ is a thickness of the i-th film layer; and $L_1$ and $L_2$ satisfy a following formula:

$$|L_1 - L_2| \le 20\bar{n} + \frac{(k-1)\lambda_B}{2^{k-1}};$$

where $\bar{n}$ is an average refractive index of film layers located between the first auxiliary layer and the third auxiliary layer and opposite to the first blue light-emitting layer to a center wavelength of blue light, $\lambda_B$ is a wavelength at a target spectrum peak of the blue light, and k is a positive integer.

In some embodiments, the plurality of first light-emitting layers further include a plurality of first red light-emitting layers and a plurality of first green light-emitting layers. A first red light-emitting layer and the first blue light-emitting layer have different thicknesses, and/or a first green light-emitting layer and the first blue light-emitting layer have different thicknesses.

In some embodiments, the plurality of second light-emitting layers further include a plurality of second red light-emitting layers and a plurality of second green light-emitting layers. A second red light-emitting layer and the second blue light-emitting layer have different thicknesses, and/or a second green light-emitting layer and the second blue light-emitting layer have different thicknesses.

In some embodiments, the second auxiliary layer includes a first micro cavity adjustment layer. Of the first micro cavity adjustment layer, a portion opposite to the second red light-emitting layer and a portion opposite to the second blue light-emitting layer have different thicknesses; and/or of the first micro cavity adjustment layer, a portion opposite to the second green light-emitting layer and the portion opposite to the second blue light-emitting layer have different thicknesses.

In some embodiments, the first micro cavity adjustment layer includes a second hole transport layer, first red sub-micro cavity adjustment layers, first green sub-micro cavity adjustment layers, and first blue sub-micro cavity adjustment layers. A first red sub-micro cavity adjustment layer is provided between the second hole transport layer and the second red light-emitting layer. A first green sub-micro cavity adjustment layer is provided between the second hole transport layer and the second green light-emitting layer. A first blue sub-micro cavity adjustment layer is provided between the second hole transport layer and the second blue light-emitting layer. The first red sub-micro cavity adjustment layer and the first blue sub-micro cavity adjustment layer have different thicknesses, and/or the first green sub-micro cavity adjustment layer and the first blue sub-micro cavity adjustment layer have different thicknesses.

In some embodiments, the first red sub-micro cavity adjustment layer includes a red hole transport layer and a red electron blocking layer that are stacked in sequence along a direction away from the backplate, and the first green sub-micro cavity adjustment layer includes a green hole transport layer and a green electron blocking layer that are stacked in sequence along the direction away from the backplate. The red hole transport layer and the green hole transport layer are each used to adjust a length of a corresponding sub-micro cavity in the micro cavity.

In some embodiments, at least for a first light-emitting layer of one color, a wavelength of light emitted by the first light-emitting layer is less than a wavelength of light emitted by a second light-emitting layer of a same color.

In some embodiments, the first light-emitting layers each contain a first guest material, and the second light-emitting layers each contain a second guest material. At least for a first light-emitting layer of one color, an emission spectrum of a first guest material of the first light-emitting layer at least partially overlaps with an absorption spectrum of a second guest material of a second light-emitting layer of a same color.

In some embodiments, an overlapping range of the emission spectrum of the first guest material and the absorption spectrum of the second guest material is greater than or equal to 60% of a wavelength range of the emission spectrum of the first guest material.

In some embodiments, an overlapping range of the emission spectrum of the first guest material and the absorption spectrum of the second guest material is greater than or equal to 60% of a wavelength range of the absorption spectrum of the second guest material.

In some embodiments, a peak of an emission spectrum of a first guest material of the first red light-emitting layer is in a range of 560 nm to 570 nm, inclusive; and a peak of an absorption spectrum of a second guest material of the second red light-emitting layer is in a range of 595 nm to 605 nm, inclusive.

In some embodiments, a peak of an emission spectrum of a first guest material of the first green light-emitting layer is in a range of 500 nm to 510 nm, inclusive; and a peak of an absorption spectrum of a second guest material of the second green light-emitting layer is in a range of 515 nm to 525 nm, inclusive.

In some embodiments, at least for a first light-emitting layer of one color, a first guest material of the first light-emitting layer includes at least one luminescent material. In a case where the first guest material includes two luminescent materials, a distance between peaks of emission spectra of the two luminescent materials is less than or equal to 30 nm.

In some embodiments, the first guest material includes the two luminescent materials; and in the two luminescent materials, at least one luminescent material is doped with boron element, and a doping ratio of the boron element is in a range of 0.5% to 5%, inclusive.

In some embodiments, at least for a second light-emitting layer of one color, a second guest material of the second light-emitting layer includes at least one luminescent material. In a case where the second guest material includes two luminescent materials, a distance between peaks of emission spectra of the two luminescent materials is less than or equal to 30 nm.

In some embodiments, the second guest material includes the two luminescent materials. In the two luminescent materials, at least one luminescent material is doped with boron element, and a doping ratio of the boron element is in a range of 0.5% to 5%, inclusive.

In some embodiments, the first guest material includes at least one of a fluorescent-like material, a phosphorescent-like material, and a thermally activated delayed fluorescence material; and/or the second guest material includes at least one of a fluorescent-like material, a phosphorescent-like material, and a thermally activated delayed fluorescence material having multiple resonance property.

In some embodiments, the first light-emitting layer further contains a first host material, and the first host material is a single host material or a P-type and N-type hybrid host material; and the second light-emitting layer further contains a second host material, and the second host material contains a bipolar host material.

In some embodiments, the bipolar host material is a single host material or a P-type and N-type hybrid host material. In a case where the second host material is the P-type and N-type hybrid host material, an N-type component of the host material has thermally activated delayed fluorescence property.

In some embodiments, the first red light-emitting layer and the second red light-emitting layer are provided opposite to each other, the first green light-emitting layer and the second green light-emitting layer are provided opposite to each other, and the first blue light-emitting layer and the second blue light-emitting layer are provided opposite to each other.

In some embodiments, the first auxiliary layer includes a light-transmitting conductive layer, a hole injection layer and a second micro cavity adjustment layer that are stacked in sequence along a direction away from the backplate. The second micro cavity adjustment layer includes a first hole transport layer, second red sub-micro cavity adjustment layers, second green sub-micro cavity adjustment layers, and second blue sub-micro cavity adjustment layers. A second red sub-micro cavity adjustment layer is provided between the first hole transport layer and the first red light-emitting layer. A second green sub-micro cavity adjustment layer is provided between the first hole transport layer and the first green light-emitting layer. A second sub-blue micro cavity adjustment layer is provided between the first hole transport layer and the first blue light-emitting layer.

In some embodiments, the first auxiliary layer includes a light-transmitting conductive layer, a hole injection layer and a second micro cavity adjustment layer that are stacked in sequence along a direction away from the backplate. The second micro cavity adjustment layer includes a first hole transport layer and an electron blocking layer that are stacked in sequence along a direction away from the backplate.

In some embodiments, the first auxiliary layer includes a light-transmitting conductive layer, a hole injection layer and a second micro cavity adjustment layer that are stacked in sequence along a direction away from the backplate. The second micro cavity adjustment layer includes a first hole transport layer, a second blue sub-micro cavity adjustment layer, second red sub-micro cavity adjustment layers, and second green sub-micro cavity adjustment layers. The second blue sub-micro cavity adjustment layer is provided on a side of the first hole transport layer away from the backplate. A second red sub-micro cavity adjustment layer is provided between the second blue sub-micro cavity adjustment layer and the first red light-emitting layer. A second green sub-micro cavity adjustment layer is provided between the second blue sub-micro cavity adjustment layer and the first green light-emitting layer.

In some embodiments, the micro cavity includes a plurality of sub-microcavities, and the plurality of sub-microcavities include red sub-microcavities corresponding to the first red light-emitting layers, green sub-microcavities corresponding to the first green light-emitting layers, and blue sub-microcavities corresponding to the first blue light-emitting layers. Film layers that are located between the anode layer and the cathode layer, and correspond to a sub-micro cavity of any one color are in a number of c, the film layers with the number of c have an optical thickness of $L_3$, and $L_3$ satisfies:

$$L_3 = \sum_{j=1}^{c} n_j r_j;$$

where c is a positive integer, $n_j$ is a refractive index of a j-th film layer among the film layers with the number of c, and $r_j$ is a thickness of the j-th film layer.

The sub-micro cavity of any one color satisfies:

$$2L_3 + \frac{\varphi}{2\pi}\lambda = m\lambda;$$

where m is a natural number, λ is an interference wavelength, and o is a phase shift caused by the anode layer.

In some embodiments, a length of a blue sub-micro cavity is less than a length of a red sub-micro cavity, and a length of the blue sub-micro cavity is less than a length of a green sub-micro cavity.

In some embodiments, the second auxiliary layer further includes a first hole blocking layer, a first electron transport layer, a first charge generating layer, and a second charge generating layer that are located on a side of the first micro cavity adjustment layer proximate to the backplate and are stacked in sequence along a direction away from the backplate; and/or the third auxiliary layer includes: a second hole blocking layer, a second electron transport layer, and an electron injection layer that are stacked in sequence along the direction away from the backplate.

In some embodiments, a thickness of the first hole blocking layer is less than or equal to 10 nm; and/or a thickness of the first electron transport layer is in a range of 15 nm to 50 nm, inclusive; and/or a thickness of the first charge generating layer is less than or equal to 10 nm; and/or a thickness of the second charge generating layer is less than or equal to 10 nm; and/or a thickness of the second hole blocking layer is less than or equal to 10 nm; and/or a thickness of the second electron transport layer is in a range of 15 nm to 50 nm, inclusive.

In some embodiments, 2 a thickness of the first blue light-emitting layer is in a range of 15 nm to 60 nm, inclusive; and/or a thickness of the second blue light-emitting layer is in a range of 10 nm to 50 nm, inclusive.

In some embodiments, the second auxiliary layer is plural in number, and any two adjacent second auxiliary layers are provided therebetween with a plurality of first light-emitting layers of at least two different colors or a plurality of second light-emitting layers of at least two different colors.

In another aspect, a display apparatus is provided. The display apparatus includes the display substrate according to any of the above embodiments.

BRIEF DESCRIPTION OF THE DRAWINGS

In order to describe technical solutions in the present disclosure more clearly, the accompanying drawings to be used in some embodiments of the present disclosure will be introduced briefly; however, the accompanying drawings to be described below are merely drawings of some embodiments of the present disclosure, and a person of ordinary skill in the art can obtain other drawings according to those drawings. In addition, the accompanying drawings to be described below may be regarded as schematic diagrams, and are not limitations on actual sizes of products involved in the embodiments of the present disclosure.

DESCRIPTION OF THE INVENTION

Figure 1:
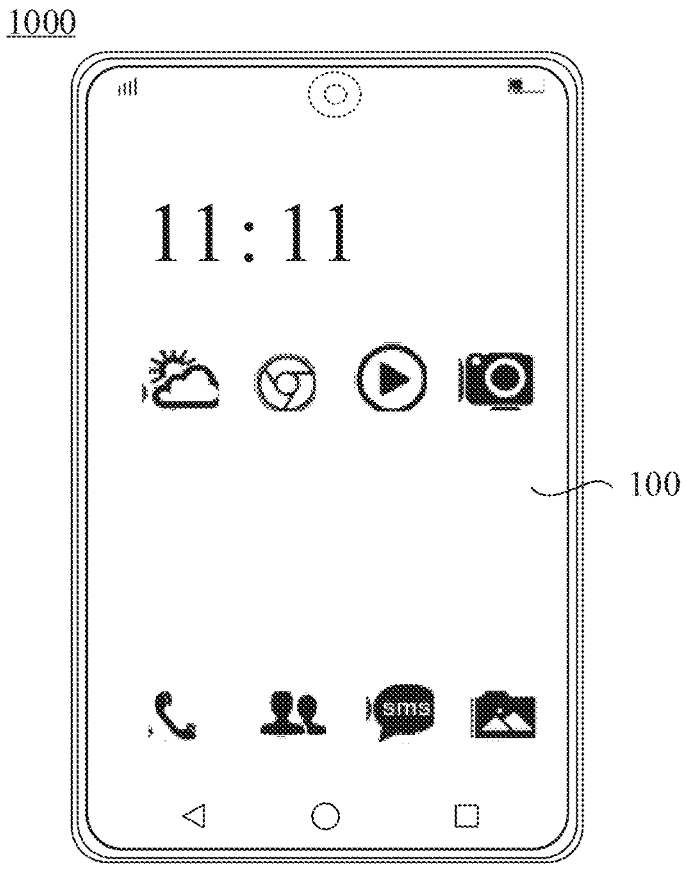
FIG. 1 is a structural diagram of a display apparatus, in accordance with some embodiments of the present disclosure.

The technical solutions in some embodiments of the present disclosure will be described clearly and completely with reference to the accompanying drawings; however, the described embodiments are merely some but not all embodiments of the present disclosure. All other embodiments obtained by a person of ordinary skill in the art based on embodiments of the present disclosure shall be included in the protection scope of the present disclosure.

Unless the context requires otherwise, throughout the specification and the claims, the term “comprise” and other forms thereof such as the third-person singular form “comprises” and the present participle form “comprising” are construed as an open and inclusive meaning, i.e., “including, but not limited to.” In the description of the specification, the terms such as “one embodiment,” “some embodiments,” “exemplary embodiments,” “example,” “specific example,” or “some examples” are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

The terms "first" and "second" are used for descriptive purposes only, and are not to be construed as indicating or implying a relative importance or implicitly indicating a number of indicated technical features. Thus, features defined with "first" or "second" may explicitly or implicitly include one or more of the features. In the description of the embodiments of the present disclosure, the term "a plurality of" or "multiple" means two or more unless otherwise specified.

In the description of some embodiments, the term "connected" and extensions thereof may be used. For example, the term "connected" may be used in the description of some embodiments to indicate that two or more components are in direct physical or electrical contact with each other. The embodiments disclosed herein are not necessarily limited to the content herein.

The phrase "at least one of A, B, and C" has the same meaning as the phrase "at least one of A, B, or C", both including the following combinations of A, B, and C: only A, only B, only C, a combination of A and B, a combination of A and C, a combination of B and C, and a combination of A, B, and C.

The phrase "A and/or B" includes the following three combinations: only A, only B, and a combination of A and B.

As used herein, the term "if" is, optionally, construed as "when" or "in a case where" or "in response to determining that" or "in response to detecting," depending on the context. Similarly, depending on the context, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]."

The use of the phrase "applicable to" or "configured to" herein means an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values other than those stated.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views that are schematic illustrations of idealized embodiments. In the accompanying drawings, thicknesses of layers and areas of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display substrate and a display apparatus, and the display substrate 100 and the display apparatus 1000 are each described below in connection with the accompanying drawings.

As shown in FIG. 1, some embodiments of the present disclosure provide a display apparatus 1000. The display apparatus 1000 may be any apparatus that is capable of displaying images whether in motion (e.g., a video) or stationary (e.g., a static image), and whether textual or graphical. More specifically, it is expected that the embodiments may be implemented in or associated with a variety of electronic devices. The variety of electronic devices may include (but is not limit to), for example, mobile telephones, wireless devices, personal data assistants (PDA), hand-held or portable computers, GPS receivers/navigators, cameras, MP4 video players, video cameras, game consoles, watches, clocks, calculators, TV monitors, flat panel displays, computer monitors, automobile displays (such as odometer displays), navigators, cockpit controllers and/or displays, camera view displays (such as rear view camera displays in vehicles), electronic photos, electronic billboards or indicators, projectors, building structures, packagings and aesthetic structures (such as a display for an image of a piece of jewelry) and the like.

In some examples, the display apparatus 1000 includes a frame, and the display substrate 100, a circuit board, a data driver integrated circuit (IC) and other electronic accessories that are provided in the frame.

The display substrate 100 may be, for example, an organic light-emitting diode (OLED) display substrate, a quantum dot light-emitting diode (QLED) display substrate, a micro light-emitting diode (Micro LED) display substrate or a mini light-emitting diode (Mini LED) display substrate, which is not specifically limited in the present disclosure.

Some embodiments of the present disclosure will be schematically described below by taking an example in which the display substrate 100 is an OLED display substrate.

Figure 2:
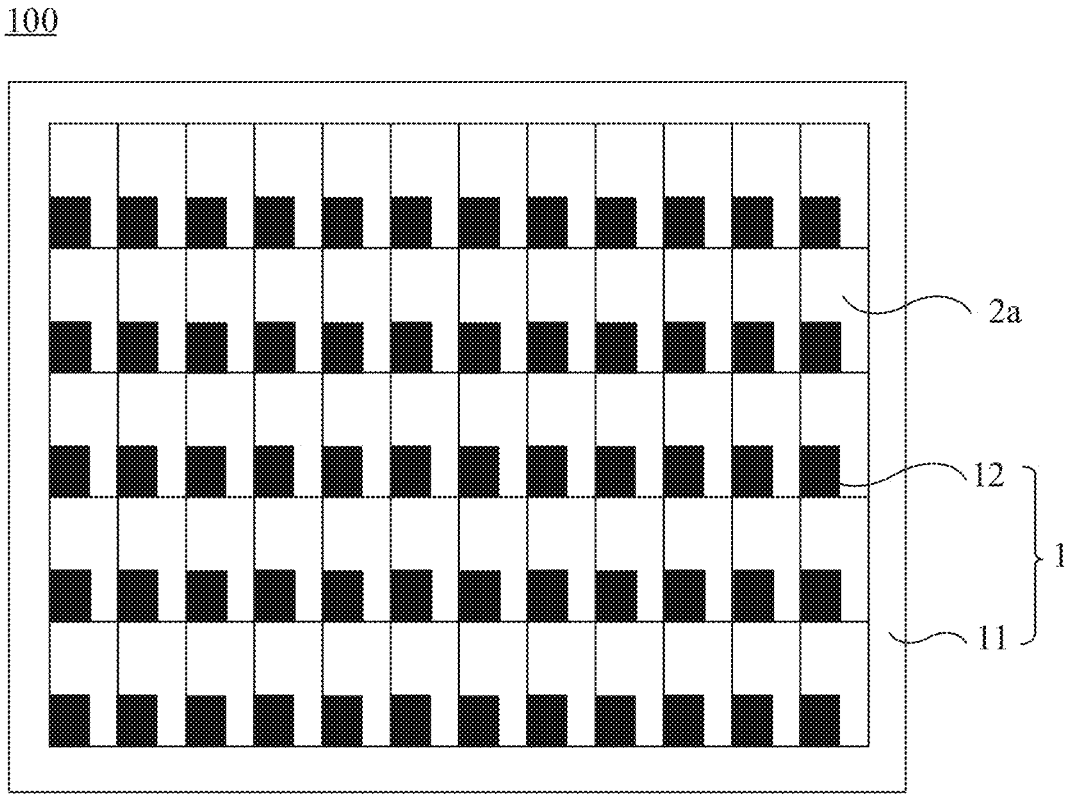
FIG. 2 is a structural diagram of a display substrate, in accordance with some embodiments of the present disclosure.

In some embodiments, as shown in FIG. 2, the display substrate 100 includes a backplate 1.

In some examples, the backplate 1 includes a substrate 11 and a plurality of pixel driving circuits 12 provided on the substrate 11.

The type of the substrate 11 may vary, which may be set according to actual needs.

For example, the substrate 11 may be a rigid substrate. The material of the rigid substrate may, for example, include glass, quartz, or plastic.

For example, the substrate 11 may be a flexible substrate. The material of the flexible substrate may, for example, include a polyethylene terephthalate (PET), a polyethylene naphthalate two formic acid glycol ester (PEN), or a polyimide (PI).

In some examples, the plurality of pixel driving circuits 12 are arranged in an array, for example.

The structure of the pixel driving circuit 12 may vary, which may be set according to actual needs. For example, the pixel driving circuit 12 may be in a structure of "3T1C", "4T1C", "6T1C", "7T1C", "6T2C", "7T2C" or "8T2C". Here, "T" represents a transistor, and a number before "T" represents the number of thin film transistors; and "C" represents a storage capacitor, and a number before "C" represents the number of storage capacitors.

Figure 3:
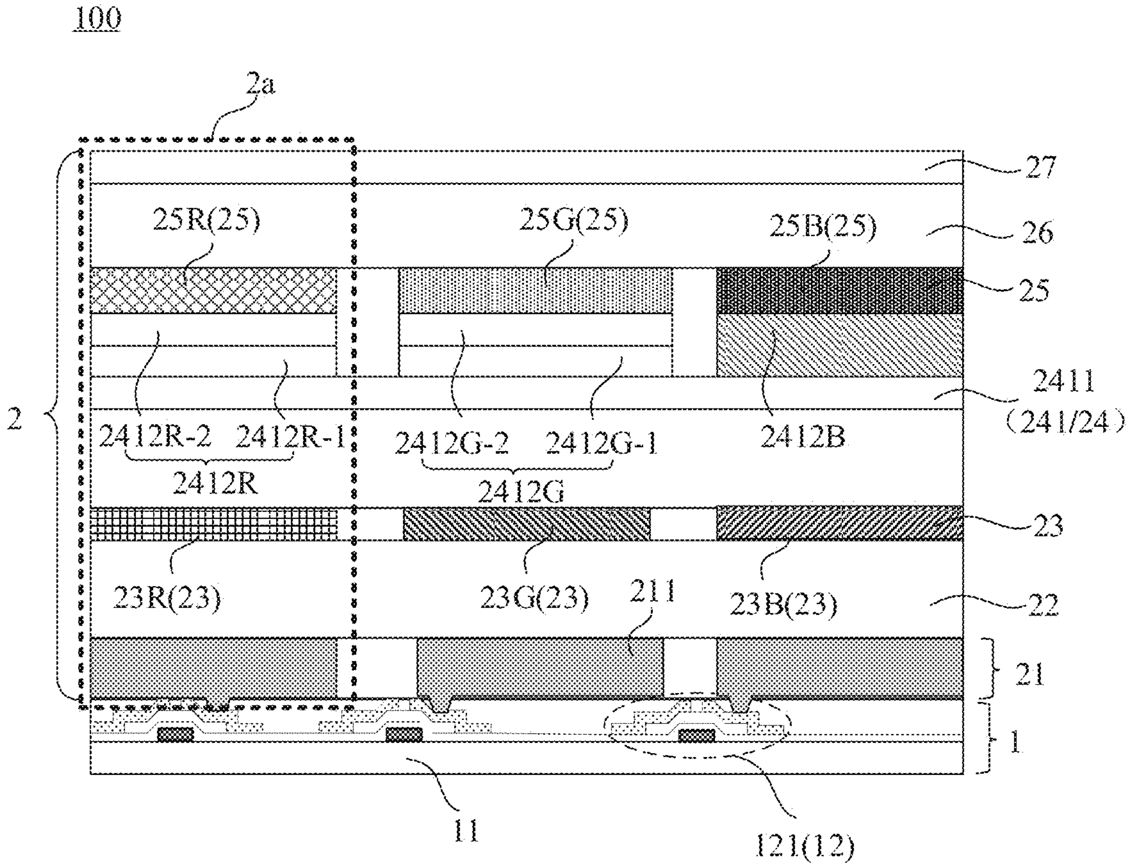
FIG. 3 is a structural diagram of another display substrate, in accordance with some embodiments of the present disclosure.

For example, the pixel driving circuit 12 is represented by one transistor 121 therein in FIG. 3.

In some embodiments, as shown in FIG. 3, the display substrate 100 further includes a light-emitting device layer 2.

In some examples, the light-emitting device layer 2 includes a plurality of light-emitting devices 2*a*, in which the plurality of light-emitting devices 2*a* are, for example, arranged in an array. Here, the light-emitting devices 2*a* are, for example, OLEDs.

For example, the pixel driving circuits 12 are electrically connected to the light-emitting devices 2*a*. Here, the electrical connection relationship between the two includes various types, which may be set according to actual needs, and the present disclosure does not limit this.

For example, the pixel driving circuits 12 and the light-emitting devices 2*a* may be electrically connected in a one-to-one correspondence. As another example, a single pixel driving circuit 12 may be electrically connected to multiple light-emitting devices 2*a*. As another example, multiple pixel driving circuits 12 may be electrically connected to a single light-emitting device 2*a*.

Hereinafter, the structure of the display substrate 100 is schematically illustrated as an example in which the pixel driving circuits 12 and the light-emitting devices 2*a* are electrically connected in a one-to-one correspondence.

It will be appreciated that each pixel driving circuit 12 is capable of generating a driving signal and transmitting the driving signal to a light-emitting device 2*a* corresponding thereto, so as to control a light-emitting state of the light-emitting device 2*a*. The light-emitting state includes, for example, the light-emitting device 2*a* emitting light, the light-emitting device 2*a* not emitting light, and at what brightness the light-emitting device 2*a* emitting light. The plurality of pixel driving circuits 12 together control light-emitting states of the plurality of light-emitting devices 2*a*, which in turn may enable the display substrate 100 to realize an image display.

Here, each pixel driving circuit 12 and a light-emitting device 2*a* electrically connected thereto, may be referred to as a sub-pixel.

It should be noted that the display substrate realizes a full-color display in two main methods, one of which is to provide the full-color display through individual light-emitting units R/G/B, and the other is to provide the full-color display through color conversion or color filtering.

In one implementation, providing the full-color display through individual light-emitting units R/G/B refers to that the light-emitting device mainly includes an anode, a light-emitting layer, and a cathode stacked in sequence along a direction away from the substrate, in which the light-emitting layer may be a red light-emitting layer, a green light-emitting layer, or a blue light-emitting layer, and accordingly, the light-emitting device may be a red light-emitting device, a green light-emitting device, or a blue light-emitting device. The red light-emitting device is capable of emitting red light under the control of a pixel driving circuit corresponding thereto, the green light-emitting device is capable of emitting green light under the control of a pixel driving circuit corresponding thereto, and the blue light-emitting device is capable of emitting blue light under the control of a pixel driving circuit corresponding thereto. In this way, the plurality of light-emitting devices are coordinated so that the full-color display can be realized. However, the luminous efficiency and luminous brightness of the light-emitting devices are low in this implementation.

In the other implementation, there are two main methods of providing the full-color display through the color conversion or color filtering.

Figure 4:
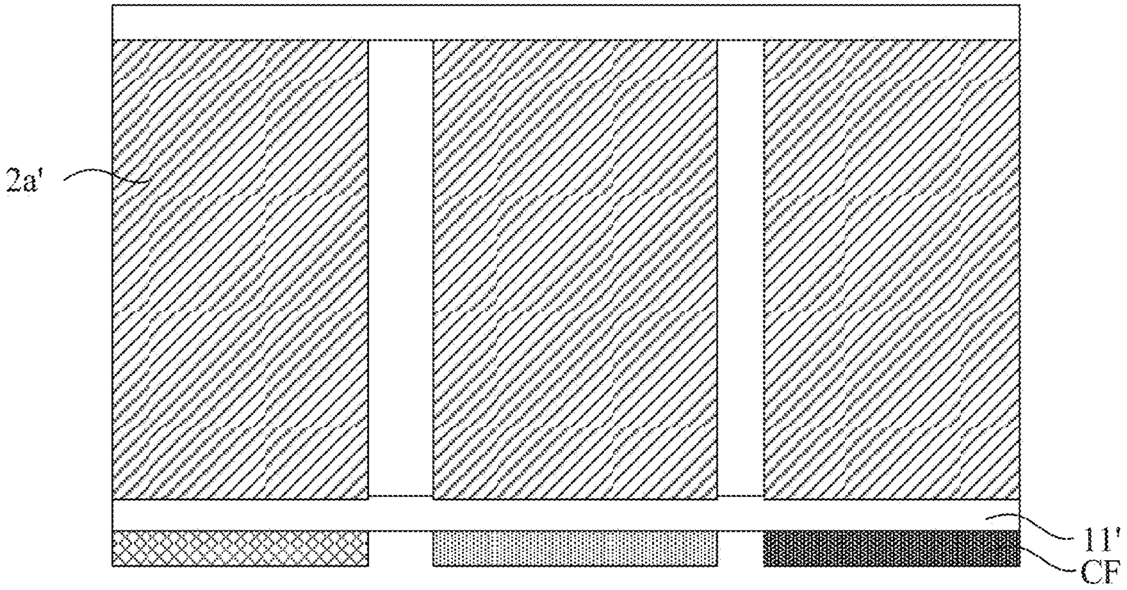
FIG. 4 is a structural diagram of a display substrate in the first method.

As shown in FIG. 4, in a first method, there exist first light-emitting devices 2*a*' each being a light-emitting device of bottom-emission in tandem, and the first light-emitting device 2*a*' is used to emit white light. The display substrate further includes a color filter CF provided on a side of a first substrate 11' away from the first light-emitting devices 2*a*'. The white light emitted by the first light-emitting device 2*a*' is converted into red light, green light, or blue light after passing through the color filter CF, thereby realizing the full-color display. However, the structure of the light-emitting device of bottom-emission makes it more difficult to improve the brightness under a front viewing angle; in addition, if a light-emitting device of top-emission is used, the process complexity will be increased, and the loss of light in certain bands will be too large.

Figure 5:
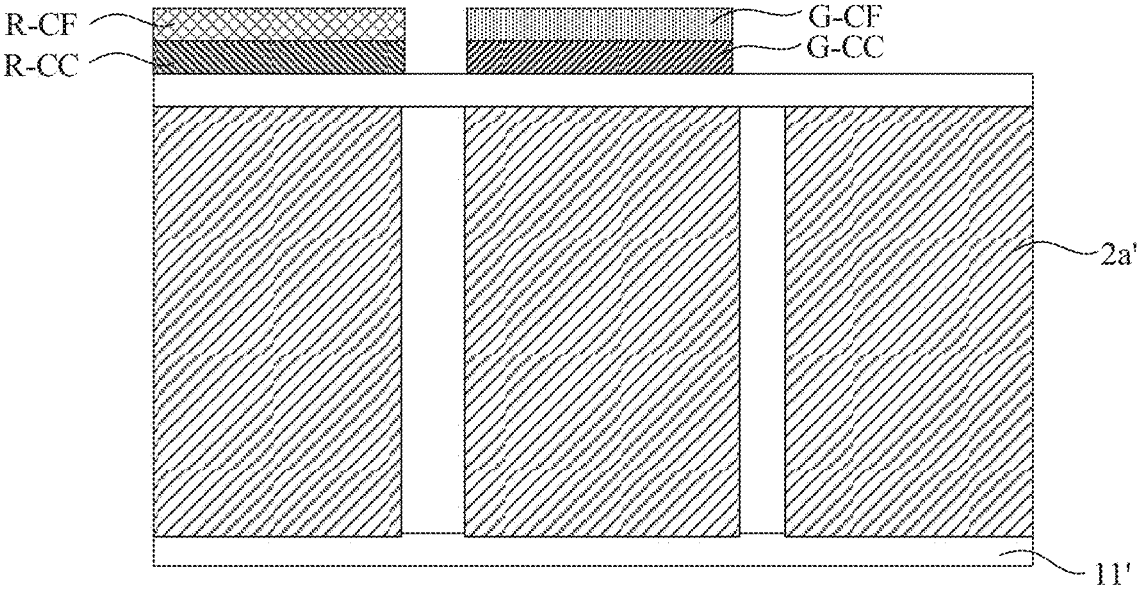
FIG. 5 is a structural diagram of a display substrate in the second method.

As shown in FIG. 5, in a second method, there exist first light-emitting devices 2*a*' each being a light-emitting device of top-emission in tandem, and the first light-emitting device 2*a*' is used to emit blue light. The display substrate further includes a red quantum dot conversion layer R-CC and a green quantum dot conversion layer G-CC, which are provided on a side of the first light-emitting devices 2*a*' away from a first substrate 11'. The blue light passing through the red quantum dot conversion layer R-CC can be converted to red light, and the blue light passing through the green quantum dot conversion layer G-CC can be converted to green light, thereby realizing the full-color display. However, the color purity of the transformed red and green light is low due to the influence of the light conversion rates of the red quantum dot conversion layer R-CC and the green quantum dot conversion layer G-CC per se, and therefore, it is necessary to match corresponding filters. For example, it is necessary to provide a red filter R-CF on a side of the red quantum dot conversion layer R-CC away from the first substrate 11' and to provide a green filter G-CF on a side of the green quantum dot conversion layer G-CC away from the first substrate 11' so as to improve the color purity. This raises the process complexity of the display substrate and increases the power consumption of the display substrate.

In light of this, as shown in FIG. 3, in some embodiments of the present disclosure, the light-emitting device layer 2 includes an anode layer 21 a first auxiliary layer 22, a plurality of first light-emitting layers 23, a second auxiliary layer 24, a plurality of second light-emitting layers 25, a third auxiliary layer 26, and a cathode layer 27, which are provided on the backplate 1.

In some examples, as shown in FIG. 3, the anode layer 21 includes a plurality of anodes 211, and the plurality of anodes 211 are, for example, arranged in an array. Therein, a single anode 211 corresponds to one light-emitting device 2*a*, and each light-emitting device 2*a* is electrically connected, for example, to a corresponding pixel driving circuit 12 through an anode 211 thereof. The anode 211 can receive a driving signal from the corresponding pixel driving circuit 12, and cooperate with such corresponding pixel driving circuit 12 to realize individual control of the light-emitting device 2*a*.

For example, the material of the anode layer 21 includes a conductive material having a relatively high work function. The structure of the anode layer 21 may, for example, be a single-layer structure, or may, for example, be a structure in which multiple film layers are stacked in sequence.

For example, in a case where the structure of the anode layer 21 is a single-layer structure, the single-layer structure has a relatively good reflection performance for light rays and is capable of reflecting light rays directed toward the anode layer 21.

For example, in a case where the structure of the anode layer 21 is a structure in which multiple film layers are stacked in sequence, a film layer away from the backplate 1 among the multiple film layers has a relatively good light reflection performance and is capable of reflecting light rays directed toward the anode layer 21. The material of the film layer with a relatively good light reflection performance may include, for example, at least one of Al (aluminum), Ag (silver), or Mg (magnesium). And, a film layer proximate to the backplate 1 among the multiple film layers may have, for example, a relatively good light transmittance performance. The material of the film layer with a relatively good light transmittance performance may include, for example, ITO (indium tin oxide), IZO (indium zinc oxide), or the like.

For example, a method of forming the anodes 211 includes: forming (e.g., using a sputtering process) a conductive film (which is a single-layer structure or a structure in which multiple film layers are stacked in sequence) on the backplate 1, and then patterning the conductive film (e.g., etching the conductive film using a photolithography process), to obtain the plurality of anodes 211 that are separate from each other.

It will be noted that the display substrate 100 may further include a pixel defining layer provided on a side of the anode layer 21 away from the substrate 11. The pixel defining layer has a plurality of openings provided in one-to-one correspondence with the plurality of anodes 211 described above. Each opening exposes a portion of an anode 211 corresponding thereto, so as to facilitate the contact between the anode 211 and a film layer located on a side of the anode 211 away from the substrate 11 to form an electrical connection between the anode 211 and the film layer.

In some examples, as shown in FIG. 3, the first auxiliary layer 22 is provided on a side of the anode layer 21 away from the substrate 11. For example, the first auxiliary layer 22 is located on a side of the above pixel defining layer away from the substrate 11.

For example, the first auxiliary layer 22 may contact the anode 211 through the opening of the pixel defining layer to form an electrical connection.

For example, the first auxiliary layer 22 includes film layers stacked in sequence, the number of the film layers is a, where a is a positive integer. For example, the first auxiliary layer 22 includes one film layer, two film layers, three film layers or four film layers (a=1, 2, 3 or 4).

For example, in a case where the first auxiliary layer 22 includes one film layer, the first auxiliary layer 22 covers the anode layer 21. That is, different light-emitting devices 2*a* share the first auxiliary layer 22.

For example, in a case where the first auxiliary layer 22 includes at least two film layers, at least one film layer covers the anode layer 21. That is, different light-emitting devices 2*a* share the at least one film layer.

For example, the first auxiliary layer 22 may be formed using a vapor deposition process in embodiments of the present disclosure.

By making different light-emitting devices 2*a* share the film layer in the first auxiliary layer 22, patterning for the first auxiliary layer 22 may be avoided, which is beneficial to simplifying the preparation process of the first auxiliary layer 22 and the display substrate 100.

In some examples, as shown in FIG. 3, the plurality of first light-emitting layers 23 described above are provided on a side of the first auxiliary layer 22 away from the substrate 11. For example, the plurality of first light-emitting layers 23 may be located in the same layer, and each first light-emitting layer 23 is in contact with the first auxiliary layer 22 to form an electrical connection. Of course, there may exist at least two first light-emitting layers 23 provided in a stack. The embodiments of the present disclosure are illustrated by an example in which the plurality of first light-emitting layers 23 are located in the same layer.

For example, the plurality of first light-emitting layers 23 described above and the plurality of anodes 211 in the anode layer 21 are provided in a one-to-one correspondence. Each first light-emitting layer 23 is opposite to a respective anode 211, that is, orthographic projections of the two on the substrate 11 partially overlap or coincide.

For example, the plurality of first light-emitting layers 23 have at least two different colors, and include at least a plurality of first blue light-emitting layers 23B.

For example, the plurality of first light-emitting layers 23 described above have two different colors. For example, the plurality of first light-emitting layers 23 include a plurality of first blue light-emitting layers 23B and a plurality of first red light-emitting layers 23R. Alternatively, the plurality of first light-emitting layers 23 include a plurality of first blue light-emitting layers 23B and a plurality of first green light-emitting layers 23G.

As another example, the plurality of first light-emitting layers 23 described above have three different colors. For example, the plurality of first light-emitting layers 23 include a plurality of first blue light-emitting layers 23B, a plurality of first red light-emitting layers 23R, and a plurality of first green light-emitting layers 23G.

Since the plurality of first light-emitting layers 23 described above have at least two different colors, the plurality of first light-emitting layers 23 need to be prepared and formed in different processes, in which first light-emitting layers 23 of each color may correspond to one process. For example, the plurality of first light-emitting layers 23 described above have two different colors and are formed using a vapor deposition process. In this case, first light-emitting layer 23 of one color may be formed by vapor deposition in one procedure, and then first light-emitting layer 23 of the other color may be formed by vapor deposition in another procedure.

It will be noted that the first auxiliary layer 22 described above is located between the anode layer 21 and the plurality of first light-emitting layers 23, and the first auxiliary layer 22 is mainly used to increase the hole mobility and reduce the injection barrier of the holes, so as to increase the amount of holes migrating to the first light-emitting layers 23, and increase the combination rate of the holes and electrons migrating to the first light-emitting layers 23, thereby improving the luminous efficiency of the first light-emitting layers 23.

In some examples, as shown in FIG. 3, the second auxiliary layer 24 described above is provided on a side of the plurality of first light-emitting layers 23 away from the substrate 11. That is, the plurality of first light-emitting layers 23 are provided between the first auxiliary layer 22 and the second auxiliary layer 24. The second auxiliary layer 24 and each first light-emitting layer 23 are in contact to form an electrical connection.

For example, the second auxiliary layer 24 includes a plurality of film layers stacked in sequence, and different light-emitting devices 2*a* share the second auxiliary layer 24.

For example, the second auxiliary layer 24 may be formed using a vapor deposition process in embodiments of the present disclosure.

By making different light-emitting devices 2*a* share a film layer in the second auxiliary layer 24, patterning for the second auxiliary layer 24 may be avoided, which is beneficial to simplifying the preparation process of the second auxiliary layer 24 and the display substrate 100.

In some examples, as shown in FIG. 3, the plurality of second light-emitting layers 25 described above are provided on a side of the second auxiliary layer 24 away from the substrate 11. For example, the plurality of second light-emitting layers 25 are located in the same layer, and each second light-emitting layer 23 is in contact with the second auxiliary layer 24 to form an electrical connection. Of course, there may exist at least two second light-emitting layers 25 provided in a stack. The embodiments of the present disclosure is illustrated by an example in which the plurality of second light-emitting layers 25 are located in the same layer.

For example, the plurality of second light-emitting layers 25 and the plurality of first light-emitting layers 23 are provided in a one-to-one correspondence. Each second light-emitting layer 25 is opposite to a respective first light-emitting layer 23, that is, orthographic projections of the two on the substrate 11 partially overlap or coincide. In addition, of each second light-emitting layer 25 and an anode 211 corresponding thereto, orthographic projections on the substrate 11 partially overlap or coincide.

For example, the plurality of second light-emitting layers 25 have at least two different colors, and include at least a plurality of second blue light-emitting layers 25B.

For example, the plurality of second light-emitting layers 25 mentioned above have two different colors. For example, the plurality of second light-emitting layers 25 include a plurality of second blue light-emitting layers 25B and a plurality of second red light-emitting layers 25R. Alternatively, the plurality of second light-emitting layers 25 include a plurality of second blue light-emitting layers 25B and a plurality of second green light-emitting layers 25G.

As another example, the plurality of second light-emitting layers 25 have three different colors. For example, the plurality of second light-emitting layers 25 include a plurality of second blue light-emitting layers 25B, a plurality of second red light-emitting layers 25R, and a plurality of second green light-emitting layers 25G.

Since the plurality of second light-emitting layers 25 described above have at least two different colors, the plurality of second light-emitting layers 25 need to be prepared and formed in different processes, in which second light-emitting layers 25 of each color may correspond to one process. For example, the plurality of second light-emitting layers 25 described above have two different colors and are formed using a vapor deposition process. In this case, second light-emitting layer 25 of one color may be formed by vapor deposition in one procedure, and then second light-emitting layer 25 of the other color may be formed by vapor deposition in another procedure.

It will be noted that the second auxiliary layer 24 described above is located between the plurality of first light-emitting layers 23 and the plurality of second light-emitting layers 25, and the second auxiliary layer 24 is mainly used to connect the first light-emitting layers 23 and the second light-emitting layers 25 in series in order to form light-emitting devices in tandem.

In some examples, as shown in FIG. 3, the third auxiliary layer 26 described above is provided on a side of the plurality of second light-emitting layers 25 away from the substrate 11. That is, the plurality of second light-emitting layers 25 are provided between the second auxiliary layer 24 and the third auxiliary layer 26. And, the third auxiliary layer 26 and each second light-emitting layer 25 are in contact to form an electrical connection.

For example, the third auxiliary layer 26 includes film layers stacked in sequence, and the number of the film layers is b, where b is a positive integer. For example, the third auxiliary layer 26 includes one film layer, two film layers or three film layers (b=1, 2 or 3).

For example, different light-emitting devices 2*a* share the third auxiliary layer 26.

For example, the third auxiliary layer 26 may be formed using a vapor deposition process in embodiments of the present disclosure.

By making different light-emitting devices 2*a* share the third auxiliary layer 26, patterning for the third auxiliary layer 26 may be avoided, which is beneficial to simplifying the preparation process of the third auxiliary layer 26 and the display substrate 100.

In some examples, as shown in FIG. 3, the cathode layer 27 is provided on a side of the third auxiliary layer 26 away from the substrate 11, and is in contact with the third auxiliary layer 26 to form an electrical connection.

For example, different light-emitting devices 2*a* share the cathode layer 27. That is, the cathode layer 27 has a whole-layer structure.

For example, the cathode layer 27 may be formed using a vapor deposition process in embodiments of the present disclosure.

By making different light-emitting devices 2*a* share the cathode layer 27, patterning for the cathode layer 27 may be avoided, which is beneficial to simplifying the preparation process of the cathode layer 27 and the display substrate 100.

It will be noted that the third auxiliary layer 26 described above is located between the plurality of second light-emitting layers 25 and the cathode layer 27, and the third auxiliary layer 26 is mainly used to increase the electron mobility to increase the amount of electrons migrating to the second light-emitting layers 25, to increase the combination rate of holes and electrons migrating to the second light-emitting layers 25, and to avoid leakage of the holes or excitons by the combination of the holes and the electrons from the second light-emitting layers 25, thereby improving the luminous efficiency of the second light-emitting layers 25.

In some examples, the anode layer 21 has a relatively high reflectivity, and the cathode layer 27 is a film layer having semi-transparent and semi-reflective properties. Here, the "semi-transparent and semi-reflective" means that the cathode layer 27 is capable of both transmitting and reflecting light rays, and the specific transmittance and reflectance are not limited. This also means that the light-emitting devices 2*a* in the embodiments of the present disclosure are light-emitting devices of top-emission.

For example, the reflectivity of the anode layer 21 is greater than or equal to 80%.

Figure 6:
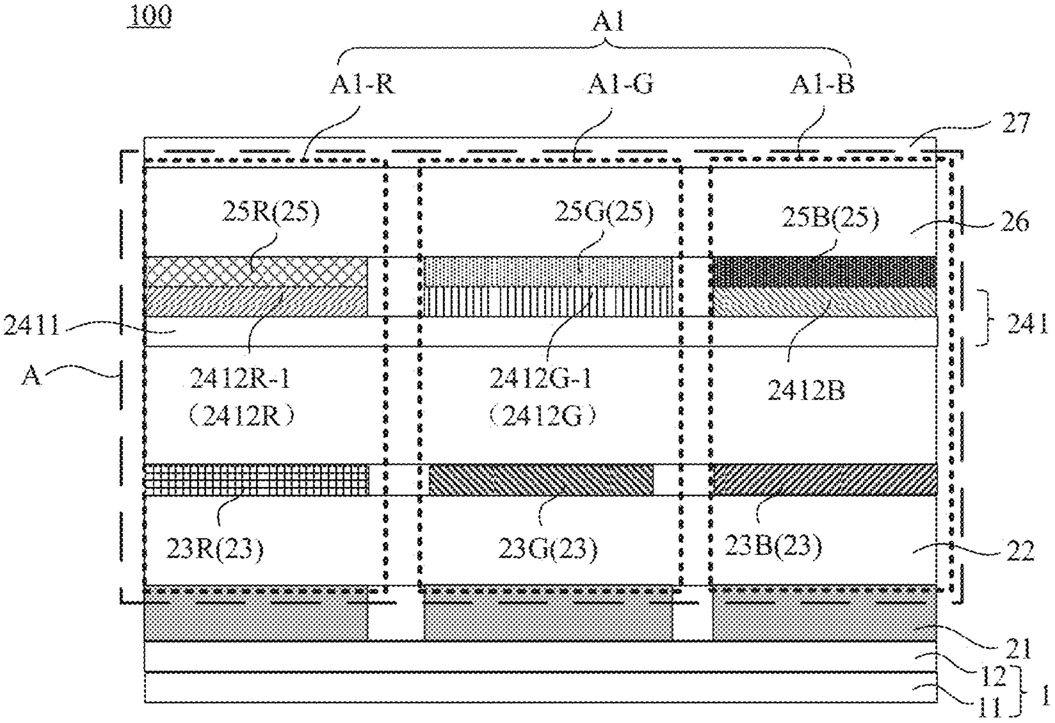
FIG. 6 is a structural diagram of yet another display substrate, in accordance with some embodiments of the present disclosure.

It will be understood that based on the properties of the anode layer 21 and the cathode layer 27, a micro cavity A can be formed between the anode layer 21 and the cathode layer 27, as shown in FIG. 6. As a result, light emitted from the first light-emitting layers 23 and the second light-emitting layers 25 can be reflected, interfered, and so on, within the micro cavity to produce a micro cavity effect, thereby enhancing the luminous intensity of the emitted light, narrowing the spectrum of the emitted light, and increasing the luminous efficiency of the light-emitting devices 2*a*. For example, the luminous intensity of blue light can be enhanced and the spectrum of blue light can be narrowed.

As shown in FIG. 3, a portion, opposite to a first blue light-emitting layer 23B, of the film layers with the number of a ("a-film layers" for short) in the first auxiliary layer 22 has an optical thickness of $L_1$, and $L_1$ satisfies:

$$L_1 = \sum_{h=1}^{a} n_h r_h;$$

where a is a positive integer, $n_h$ is a refractive index of an h-th film layer among the a-film layers, and $r_h$ is a thickness of the h-th film layer.

A portion, opposite to the first blue light-emitting layer 23B, of the film layers with the number of b ("b-film layers" for short) in the third auxiliary layer 26 has an optical thickness of $L_2$, and $L_2$ satisfies:

$$L_2 = \sum_{i=1}^{b} n_i r_i;$$

where b is a positive integer, $n_i$ is a refractive index of an i-th film layer among the b-film layers, and $r_i$ is a thickness of the i-th film layer.

$L_1$ and $L_2$ satisfy the following formula:

$$|L_1 - L_2| \le 20\overline{n} + \frac{(k-1)\lambda_B}{2^{k-1}};$$

where $\overline{n}$ is an average refractive index of film layers located between the first auxiliary layer 22 and the third auxiliary layer 26 and opposite to the first blue light-emitting layer 23B, $\lambda_B$ is a wavelength at a target spectrum peak of blue light, and k is a positive integer.

It should be noted that the above optical thickness is a refractive index of a target film layer multiplied by an actual thickness of the target film layer; and the above average refractive index is: the sum of optical thicknesses of film layers located between the first auxiliary layer 22 and the third auxiliary layer 26 and opposite to the first blue light-emitting layer 23B, divided by the sum of actual thicknesses of the film layers between the first auxiliary layer 22 and the third auxiliary layer 26 and opposite to the first blue light-emitting layer 23B. Here, the average refractive index of the film layers located between the first auxiliary layer 22 and the third auxiliary layer 26 and opposite to the first blue light-emitting layer 23B can be directly measured, for example, by a refractive index testing device (e.g., a refractometer or an ellipsometer).

It should be noted that the film layers opposite to the first blue light-emitting layer 23B represent film layers covering an opening of the pixel defining layer of a blue sub-pixel.

For example, the film layers between the first auxiliary layer 22 and the third auxiliary layer 26 and opposite to the first blue light-emitting layer 23B include the first blue light-emitting layer, the second auxiliary layer, and a second blue light-emitting layer.

The luminous efficiency and color purity of the blue light-emitting device in the display substrate 100 can be improved by making $L_1$ and $L_2$ satisfy the above-described formulae, and thus, the provision of filters in the display substrate 100 in the present disclosure may be reduced, which may reduce the blocking of the light rays emitted by the light-emitting devices 2*a* by the filters, and improve the luminous efficiency of the display substrate 100 in the present disclosure. Further, the present disclosure may achieve the same brightness as in the above-described first and second implementations in a case of reducing a driving voltage of the pixel driving circuit 12 in the display substrate 100, which in turn may reduce the power consumption of the display substrate 100 and increase the luminous lifetime of the light-emitting devices 2*a*.

Accordingly, $L_1$ and $L_2$ of a portion opposite to a first light-emitting layer 23 of another color satisfy the following formula:

$$|L_1 - L_2| \le 20\overline{n} + \frac{(k-1)\lambda_B}{2^{k-1}}.$$

In this case, the luminous efficiency and color purity of a light-emitting device of a corresponding color may also be enhanced.

In some examples, $\overline{n}$ is in a range of 1.7 to 2.0, inclusive.

For example, the value of $\overline{n}$ may be 1.7, 1.75, 1.8, 1.9 or 2.0.

In some embodiments, as shown in FIG. 3, the plurality of first light-emitting layers 23 further include a plurality of first red light-emitting layers 23R and a plurality of first green light-emitting layers 23G, in which the first red light-emitting layer 23R and the first blue light-emitting layer 23B have different thicknesses, and/or the first green light-emitting layer 23G and the first blue light-emitting layer 23B have different thicknesses.

For example, the plurality of first red light-emitting layers 23R, the plurality of first green light-emitting layers 23G, and the plurality of first blue light-emitting layers 23B can emit light rays of respective colors, so that the display substrate 100 may achieve a full-color display.

For example, by making the first red light-emitting layer 23R and the first blue light-emitting layer 23B have different thicknesses, and making the first green light-emitting layer 23G and the first blue light-emitting layer 23B have different thicknesses, a length of a portion of the micro cavity corresponding to a first light-emitting layers 23 of a respective color can be adjusted, which in turn may enhance the luminous efficacy and color purity of the light-emitting device of the respective color.

In some embodiments, as shown in FIG. 3, the plurality of second light-emitting layers 25 further include a plurality of second red light-emitting layers 25R and a plurality of second green light-emitting layers 25G, in which the second red light-emitting layer 25R and the second blue light-emitting layer 25B have different thicknesses, and/or the second green light-emitting layer 25G and the second blue light-emitting layer 25B have different thicknesses.

For example, the plurality of second red light-emitting layers 25R, the plurality of second green light-emitting layers 25G, and the plurality of second blue light-emitting layers 25B can emit light rays of respective colors, so that the display substrate 100 may achieve a full-color display.

For example, by making the second red light-emitting layer 25R and the second blue light-emitting layer 25B have different thicknesses, and making the second green light-emitting layer 25G and the second blue light-emitting layer 25B have different thicknesses, a length of a portion of the micro cavity corresponding to a second light-emitting layers 25 of a respective color can be adjusted, which in turn may enhance the luminous efficacy and color purity of the light-emitting device of the respective color.

For example, a wavelength of light emitted by a first light-emitting layer 23 is less than a wavelength of light emitted by the second red light-emitting layer 25R, or a wavelength of the light emitted by the first light-emitting layer 23 is less than a wavelength of light emitted by the second green light-emitting layer 25G. Alternatively, the wavelength of the light emitted by the first light-emitting layer 23 is less than the wavelength of the light emitted by the second red light-emitting layer 25R and is less than the wavelength of the light emitted by the second green light-emitting layer 25G, and embodiments of the present disclosure is not limited thereto.

For example, the first light-emitting layer 23 is capable of emitting blue light or yellow light.

By making the wavelength of the light emitted from the first light-emitting layer 23 less than the wavelength of the light emitted from a second light-emitting layer 25 of at least one color, the light emitted from the first light-emitting layer 23 can be made to excite at least one of the second red light-emitting layer 25R, the second green light-emitting layer 25G, and the second blue light-emitting layer 25B to emit a light of a corresponding color in a case where the light emitted from the first light-emitting layer 23 is directed to the plurality of second light-emitting layers 25, thereby increasing the luminous brightness and luminous efficiency of the display substrate 100. Moreover, as shown in FIG. 6, the light emitted from the first light-emitting layer 23 is also capable of being reflected multiple times within the micro cavity A, so that the light emitted from the first light-emitting layer 23 is able to be directed to the above-described plurality of second light-emitting layers 25 multiple times, which further increases the excitation effect of the light emitted from the first light-emitting layer 23 on at least one of the plurality of second light-emitting layers 25, thereby further increasing the luminous brightness and luminous efficiency of the display substrate 100.

It will be noted that the positional relationships between the pluralities of first red light-emitting layers 23R, first green light-emitting layers 23G and first blue light-emitting layers 23B and the pluralities of second red light-emitting layers 25R, second green light-emitting layers 25G and second blue light-emitting layers 25B include various types and may be set as needed.

In some examples, a first light-emitting layer 23 and a second light-emitting layer 25 of the same color are provided opposite to each other. That is, orthographic projections of the first light-emitting layer 23 and the second light-emitting layer 25 of the same color on the substrate 11 partially overlap or coincide.

For example, the plurality of first blue light-emitting layers 23B are provided opposite to the plurality of second blue light-emitting layers 25B, respectively; the plurality of first red light-emitting layers 23R are provided opposite to the plurality of second red light-emitting layers 25R, respectively; and the plurality of first green light-emitting layers 23G are provided opposite to the plurality of second green light-emitting layers 25G, respectively.

By arranging the first light-emitting layer 23 and the second light-emitting layer 25 of the same color oppositely, the luminous efficiency of the light-emitting device 2*a* can be improved, and the color purity of the red light, green light or blue light emitted by the light-emitting device 2*a* can be improved.

In some embodiments, the first light-emitting layer 23 contains a first guest material, and the second light-emitting layer 25 contains a second guest material. The emission spectrum of the first guest material at least partially overlaps with the absorption spectrum of the second guest material of the second light-emitting layer 25 of at least one color.

It will be noted that the respective materials of the first light-emitting layer 23 and the second light-emitting layer 25 each contain a host material and a guest material doped in the host material. The above host material itself has good film-forming properties and can be used in mix with other materials with excellent luminescent properties; and the guest material itself has excellent luminescent properties. The host material includes molecules in a high excitation energy state, and the molecules in the high excitation energy state can transfer their energy to the guest material. As a result, in a case where the first light-emitting layer 23 or the second light-emitting layer 25 is formed by using the host material and the guest material doped therein together, the wavelength of the light emitted from the first light-emitting layer 23 or the second light-emitting layer 25 can be varied and the luminous efficacy of the first light-emitting layer 23 or the second light-emitting layer 25 can be improved.

For example, the first guest material is a material mainly used for emitting light in the first emitting layer 23, and the second guest material is a material mainly used for emitting light in the second emitting layer 25.

The above "at least partially overlapping" means that the emission spectrum of the first guest material partially overlaps with the absorption spectrum of the second guest material of the second light-emitting layer 25 of at least one color, or that the emission spectrum of the first guest material fully overlaps with the absorption spectrum of the second guest material of the second light-emitting layer 25 of at least one color.

For example, the emission spectrum of a first guest material of the first light-emitting layer 23 at least partially overlaps with the absorption spectrum of a second guest material of a second red light-emitting layer 25R; or the emission spectrum of a first guest material of the first light-emitting layer 23 at least partially overlaps with the absorption spectrum of a second guest material of a second green light-emitting layer 25G; or the emission spectrum of a first guest material of the first light-emitting layer 23 at least partially overlaps with the absorption spectrum of a second guest material of a second blue light-emitting layer 25B. Alternatively, the emission spectrum of the first guest material of the first light-emitting layer 23 overlaps, at least partially, not only with the absorption spectrum of the second guest material of the second red light-emitting layer 25R, but also with the absorption spectrum of the second guest material of the second green light-emitting layer 25G. Embodiments of the present disclosure do not limit these.

By arranging the emission spectrum of the first guest material of the first light-emitting layer 23 to at least partially overlap with the absorption spectrum of the second guest material of the second light-emitting layer 25 of at least one color, a portion of light rays emitted from the first guest material of the first light-emitting layer 23 can be made to be absorbed by the second guest material of the second light-emitting layer 25 of the at least one color, thereby causing the second guest material of the second light-emitting layer 25 of the at least one color to emit light under the excitation of the light emitted from the first guest material, and thus increasing the luminous efficiency of the second guest material of the second light-emitting layer 25. Another portion of the light rays emitted from the first guest material of the first light-emitting layer 23 can be directed through the cathode layer 27 to form a tandem light-emitting device with the light emitted from the second light-emitting layer 25, enhancing the luminous brightness of the display substrate 100.

It will be noted that in a case where the light emitted from the first light-emitting layer 23 in the display substrate 100 is directed to the second light-emitting layer 25, the second light-emitting layer 25 can absorb the light emitted from the first light-emitting layer 23 and excite light of a corresponding color. Moreover, the first light-emitting layer 23 and the second light-emitting layer 25 may themselves form a tandem light-emitting device. As the above two luminescence mechanisms work together, the display substrate 100 will obtain a higher luminous efficiency.

It can be understood that the more overlapping portions of the emission spectrum of the first guest material with the absorption spectrum of the second guest material of the second light-emitting layer 25, the more light rays emitted by the first guest material can excite the second guest material to emit more light rays, and the more luminous efficiency of the second guest material of the second light-emitting layer 25.

In some embodiments, an overlapping range of the emission spectrum of the first guest material of the first light-emitting layer 23 and the absorption spectrum of the second guest material of the second light-emitting layer 25 is greater than or equal to 60% of a wavelength range of the emission spectrum of the first guest material.

For example, the overlapping range of the emission spectrum of the first guest material and the absorption spectrum of the second guest material may be 60%, 70%, 80%, 90%, or 99% of the wavelength range of the emission spectrum of the first guest material.

With this arrangement, greater than or equal to 60% of all light emitted by the first guest material can be absorbed by the second guest material, thereby improving the utilization rate of the light emitted by the first guest material by the second guest material.

In some embodiments, an overlapping range of the emission spectrum of the first guest material of the first light-emitting layer 23 and the absorption spectrum of the second guest material of the second light-emitting layer 25 is greater than or equal to 60% of a wavelength range of the absorption spectrum of the second guest material.

For example, the overlapping range of the emission spectrum of the first guest material and the absorption spectrum of the second guest material may be 60%, 70%, 80%, 90%, or 99% of the wavelength range of the absorption spectrum of the second guest material.

With this arrangement, more of the light emitted by the first guest material can be absorbed by the second guest material, thereby improving the utilization rate of the light emitted by the first guest material by the second guest material.

In some embodiments, at least for a first light-emitting layer 23 of one color, a first guest material of the first light-emitting layer 23 includes at least one luminescent material. In a case where the first guest material includes two luminescent materials, a distance between peaks of emission spectra of the two luminescent materials is less than or equal to 30 nm.

For example, the first guest material of the first red light-emitting layer 23R includes at least one luminescent material; or the first guest material of the first green light-emitting layer 23G includes at least one luminescent material; or the first guest material of the first blue light-emitting layer 23B includes at least one luminescent material; or the first guest material of the first red light-emitting layer 23R and the first guest material of the first green light-emitting layer 23G each include at least one luminescent material; or, there may exist other implementations, to which embodiments of the present disclosure are not limited.

For example, the first guest material may include one or two luminescent materials, which are not limited by embodiments of the present disclosure.

It can be understood that different luminescent materials can emit light of different colors. In a case where the first guest material of the first light-emitting layer 23 includes one luminescent material, the first light-emitting layer 23 can emit light of one color; and in a case where the first guest material of the first light-emitting layer 23 includes two luminescent materials, the first light-emitting layer 23 can emit light of two colors.

For example, in a case where the first guest material of the first light-emitting layer 23 includes two luminescent materials, the distance between peaks of emission spectra of the two luminescent materials may be 1 nm, 10 nm, 19 nm, 25 nm, or 30 nm.

By making the distance between peaks of emission spectra of the two luminescent materials of the first guest material less than or equal to 30 nm, it is possible to make the colors of the light rays emitted by the two luminescent materials of the first guest material more similar, and to improve the color purity of the light rays emitted by the first light-emitting layer 23.

In some embodiments, an emission spectrum of a first guest material of the first red light-emitting layer 23R overlaps with an absorption spectrum of a second guest material of the second red light-emitting layer 25R.

For example, a peak of the emission spectrum of the first guest material is in a range of 560 nm to 570 nm, inclusive; and a peak of the absorption spectrum of the second guest material of the second red light-emitting layer 25R is in a range of 595 nm to 605 nm, inclusive.

For example, the peak of the emission spectrum of the first guest material of the first red light-emitting layer 23R may be 560 nm, 562 nm, 566 nm, 568 nm, or 570 nm; and the peak of the absorption spectrum of the second guest material of the second red light-emitting layer 25R may be 595 nm, 597 nm, 600 nm, 602 nm, or 605 nm.

With this arrangement, the emission spectrum of the first guest material of the first red light-emitting layer 23R and the absorption spectrum of the second guest material of the second red light-emitting layer 25R can have a larger overlap range, thereby improving the luminous efficiency of the second guest material of the second red light-emitting layer 25R.

In some embodiments, an emission spectrum of a first guest material of the first green light-emitting layer 23G overlaps with an absorption spectrum of a second guest material of the second green light-emitting layer 25G.

For example, a peak of the emission spectrum of the first guest material is in a range of 500 nm to 510 nm, inclusive; and a peak of the absorption spectrum of the second guest material of the second green light-emitting layer 25G is in a range of 515 nm to 525 nm, inclusive.

For example, the peak of the emission spectrum of the first guest material may be 500 nm, 502 nm, 506 nm, 508 nm, or 510 nm; and the peak of the absorption spectrum of the second guest material of the second green light-emitting layer 25G may be 515 nm, 518 nm, 520 nm, 522 nm, or 525 nm.

With this arrangement, the emission spectrum of the first guest material of the first green light-emitting layer 23G and the absorption spectrum of the second guest material of the second green light-emitting layer 25G can have a larger overlap range, thereby improving the luminous efficiency of the second guest material of the second green light-emitting layer 25G.

In some embodiments, in a case where the first guest material of the first light-emitting layer 23 includes two luminescent materials, at least one of the two luminescent materials is doped with boron element, where a doping ratio of boron element is in a range of 0.5% to 5%, inclusive.

For example, the doping ratio of boron element may be 0.5%, 1.5%, 3.5%, 4%, or 5%.

In some embodiments, the first guest material of the first light-emitting layer 23 includes at least one of a fluorescent-like material, a phosphorescent-like material, and a thermally activated delayed fluorescence (TADF) material.

For example, the fluorescent-like material includes a pyrene material, a fused-carbazole material, and a boron-containing material. The phosphorescent-like material includes iridium (Ir) complex and platinum (Pt) complex. The TADF material generally has a D-A (Donor-Acceptor) structure, and the difference between S1 and T1 of the TADF material is less than 0.3 eV ($S1-T1<0.3$ eV), where S1 represents the energy level of the excited singlet state of the material, and T1 represents the energy level of the triplet electronic excited state of the material.

In some embodiments, the first light-emitting layer 23 further contains a first host material. The first host material of the first light-emitting layer 23 is a single host material or a P-type (hole-transport-type) and N-type (electron-transport-type) hybrid host material.

For example, the first host material includes at least one of an anthracene material, a fluorene material, a pyrene material, and a carbazole derivative material.

In some embodiments, a thickness of the first blue light-emitting layer 23B is in a range of 15 nm to 60 nm, inclusive.

For example, the thickness of the first blue light-emitting layer 23B may be 15 nm, 20 nm, 35 nm, 45 nm, or 60 nm.

In some embodiments, at least for a second light-emitting layer 25 of one color, a second guest material of the second light-emitting layer 25 includes at least one luminescent material. In a case where the second guest material includes two luminescent materials, a distance between peaks of emission spectra of the two luminescent materials is less than or equal to 30 nm.

For example, the second red light-emitting layer may include at least one luminescent material, or the second green light-emitting layer may include at least one luminescent material, or the second blue light-emitting layer may include at least one luminescent material. For example, the second red light-emitting layer and the second green light-emitting layer may each include at least one luminescent material.

For example, the second guest material may include one or two luminescent materials, which are not limited by embodiments of the present disclosure.

It can be understood that different luminescent materials can emit light of different colors. In a case where the second guest material of the second light-emitting layer 25 includes one luminescent material, the second light-emitting layer 25 can emit light of one color; and in a case where the second guest material of the second light-emitting layer 25 includes two luminescent materials, the second light-emitting layer 25 can emit light of two colors.

For example, in a case where the second guest material of the second light-emitting layer 25 includes two luminescent materials, of the two luminescent materials, the emission spectrum of one luminescent material has an overlapping range with the absorption spectrum of the other luminescent material, and such a configuration can increase the luminous efficacy of the two luminescent materials described above.

For example, in a case where the second guest material of the second light-emitting layer 25 includes two luminescent materials, the distance between peaks of emission spectra of the two luminescent materials may be 1 nm, 10 nm, 19 nm, 25 nm, or 30 nm.

By making the distance between peaks of emission spectra of the two luminescent materials of the second guest material of the second light-emitting layer 25 less than or equal to 30 nm, it is possible to make the colors of the light rays emitted by the two luminescent materials of the second guest material more similar, and to improve the color purity of the light rays emitted by the second light-emitting layer 25.

In some embodiments, in a case where the second guest material of the second light-emitting layer 25 includes two luminescent materials, at least one of the two luminescent materials is doped with boron element, where a doping ratio of boron element is in a range of 0.5% to 5%, inclusive.

For example, the doping ratio of boron element may be 0.5%, 1.5%, 3.5%, 4%, or 5%.

In some embodiments, the second guest material includes at least one of a fluorescent-like material, a phosphorescent-like material, and a thermally activated delayed fluorescence (TADF) material having multiple resonance (MR) property.

In some embodiments, the second light-emitting layer 25 further contains a second host material. The second host material contains a bipolar host material.

In some embodiments, the second host material is a single host material or a P-type and N-type hybrid host material, i.e., the bipolar host material is a single host material or a P-type and N-type hybrid host material.

In some examples, in a case where the second host material is the P-type and N-type hybrid host material, an N-type component of the P-type and N-type hybrid host material has TADF property.

It will be noted that in a case where the N-type component has the TADF property, the luminous efficiency of the second guest material in the second light-emitting layer 25 can be improved.

In some embodiments, a thickness of the second blue light-emitting layer 25B is in a range of 10 nm to 50 nm, inclusive.

For example, the thickness of the second blue light-emitting layer 25B may be 10 nm, 20 nm, 28 nm, 38 nm, or 50 nm.

In some embodiments, as shown in FIG. 6, the micro cavity A includes a plurality of sub-microcavities A1, and the plurality of sub-microcavities A1 include red sub-microcavities A1-R corresponding to the first red light-emitting layers 23R, green sub-microcavities A1-G corresponding to the first green light-emitting layers 23G, and blue sub-microcavities A1-B corresponding to the first blue light-emitting layers 23B. Film layers that are located between the anode layer 21 and the cathode layer 27, and correspond to a sub-micro cavity A1 of any one color are in a number of c, the film layers with the number of c (c-film layers) have an optical thickness of $L_3$, and $L_3$ satisfies:

$$L_3 = \sum_{j=1}^{c} n_j r_j;$$

where c is a positive integer, $n_j$ is a refractive index of a j-th film layer among the c-film layers, and $r_j$ is a thickness of the j-th film layer.

The sub-micro cavity of any one color satisfies:

$$2L_3 + \frac{\varphi}{2_\pi}\lambda = m\lambda;$$

where m is a natural number, λ is an interference wavelength, and φ is a phase shift caused by the anode layer 21.

For example, in a case where interference of blue light is required, the above λ is a wavelength of the blue light; in a case where interference of red light is required, the above λ is a wavelength of the red light; and in a case where interference of green light is required, the above λ is a wavelength of the green light.

For example, in a case where $L_3$ of the red sub-micro cavity A1-R satisfies the above formula, the red light emitted from the second red light-emitting layer 25R is capable of generating a micro cavity effect in the red sub-micro cavity A1-R, which can increase the brightness of the red light and increase the color purity of the red light.

Similarly, the green light emitted from the second green light-emitting layer 25G and the blue light emitted from the second blue light-emitting layer 25B are each also capable of generating a micro cavity effect in a sub-micro cavity A1 corresponding thereto, which can increase the brightness of the green light and the blue light and increase the color purity of the green light and the blue light.

In some embodiments, a length of the blue sub-micro cavity A1-B is less than a length of the red sub-micro cavity A1-R; and the length of the blue sub-micro cavity A1-B is less than a length of the green sub-micro cavity A1-G.

For example, the wavelength of the red light is in a range of 615 nm to 630 nm, inclusive; the wavelength of the green light is in a range of 515 nm to 535 nm, inclusive; and the wavelength of the blue light is in a range of 460 nm to 475 nm, inclusive. Therefore, in a case where the red light, the green light and the blue light are each capable of generating a micro cavity effect, the blue sub-micro cavity A1-B has the smallest length.

In some embodiments, as shown in FIG. 6, the second auxiliary layer 24 includes a first micro cavity adjustment layer 241. Of the first micro cavity adjustment layer 241, a portion opposite to a second red light-emitting layer 25R and a portion opposite to a second blue light-emitting layer 25B have different thicknesses; and/or of the first micro cavity adjustment layer 241, a portion opposite to a second green light-emitting layer 25G and the portion opposite to the second blue light-emitting layer 25B have different thicknesses.

For example, the first micro cavity adjustment layer 241 is used to adjust the length of the micro cavity A. By adjusting the thickness of each of portions of the first micro cavity adjustment layer 241 respectively opposite to the second red light-emitting layer 25R, the second green light-emitting layer 25G, and the second blue light-emitting layer 25B, the micro cavity effect can be generated on light of a corresponding color in the red sub-micro cavity A1-R, on light of a corresponding color in the green sub-micro cavity A1-G, and on light of a corresponding color in the blue sub-micro cavity A1-B.

In some embodiments, as shown in FIG. 6, the first micro cavity adjustment layer 241 includes: a second hole transport layer 2411, first red sub-micro cavity adjustment layers 2412R each provided between the second hole transport layer 2411 and a second red light-emitting layer 25R, first green sub-micro cavity adjustment layers 2412G each provided between the second hole transport layer 2411 and a second green light-emitting layer 25G, and first blue sub-micro cavity adjustment layers 2412B each provided between the second hole transport layer 2411 and a second blue light-emitting layer 25B. Here, the first red sub-micro cavity adjustment layer 2412R and the first blue sub-micro cavity adjustment layer 2412B have different thicknesses, and/or the first green sub-micro cavity adjustment layer 2412G and the first blue sub-micro cavity adjustment layer 2412B have different thicknesses.

In some examples, the second hole transport layer 2411 is provided as a whole layer and has an adjustable thickness.

By providing the second hole transport layer 2411 as a whole layer, the manufacturing process of the display substrate 100 may be simplified.

By adjusting the thickness of the second hole transport layer 2411, the length of the micro cavity A can be adjusted, so that the micro cavity effect can be generated on light of a corresponding color in the red sub-micro cavity A1-R, on light of a corresponding color in the green sub-micro cavity A1-G, and on light of a corresponding color in the blue sub-micro cavity A1-B.

For example, the second hole transport layer 2411 is used to lower an injection barrier of holes, increase the mobility of the holes, and facilitate the transport of the holes into the second light-emitting layer 25, which in turn can increase the accumulation of the holes in the second light-emitting layer 25, and improve the luminous efficiency and the luminous lifetime of the second light-emitting layer 25.

For example, the highest occupied molecular orbital (HOMO) energy level of the material of the second hole transport layer 2411 is in a range of −5.2 eV to −5.6 eV, inclusive. For example, the HOMO energy level of the material of the second hole transport layer 2411 is −5.2 eV, −5.3 eV, −5.4 eV, −5.5 eV, or −5.6 eV.

For example, the T1 of the material of the first red sub-micro cavity adjustment layer 2412R, the T1 of the material of the first green sub-micro cavity adjustment layer 2412G, and the T1 of the material of the first blue sub-micro cavity adjustment layer 2412B are each higher than the T1 of the luminescent material of the second light-emitting layer 25.

For example, the T1 of the materials of the first red sub-micro cavity adjustment layer 2412R, the first green sub-micro cavity adjustment layer 2412G, and the first blue sub-micro cavity adjustment layer 2412B is higher than the T1 of the luminescent material of the second light-emitting layer 25 by at least 0.2 eV.

For example, the thickness of the first blue sub-micro cavity adjustment layer 2412B is less than or equal to 10 nm.

For example, the thickness of the first blue sub-micro cavity adjustment layer 2412B may be 1 nm, 3 nm, 5 nm, 7 nm, or 10 nm.

As described above, the red light, the green light, and the blue light have different wavelengths, and in the case where the red light, the green light and the blue light are each capable of generating a micro cavity effect, the red sub-micro cavity A1-R and the blue sub-micro cavity A1-B have different lengths, and the green sub-micro cavity A1-G and the blue sub-micro cavity A1-B have different lengths. As shown in FIG. 6, the plurality of sub-microcavities A1 share the first auxiliary layer 22, part of the second auxiliary layer 24, and the third auxiliary layer 26. The first red sub-micro cavity adjustment layer 2412R and the first blue sub-micro cavity adjustment layer 2412B may be made of different thicknesses, and the first green sub-micro cavity adjustment layer 2412G and the first blue sub-micro cavity adjustment layer 2412B may be made of different thicknesses, so that the plurality of sub-microcavities A1 can satisfy desired lengths thereof by adjusting the thicknesses of the first red sub-micro cavity adjustment layer 2412R, the first green sub-micro cavity adjustment layer 2412G and the first blue sub-micro cavity adjustment layer. In this way, the above-mentioned film layers (e.g., the first auxiliary layer 22, the part of the second auxiliary layer 24, and the third auxiliary layer 26) shared by the blue sub-micro cavity A1-B, the red sub-micro cavity A1-R, and the green sub-micro cavity A1-G may each be made to have a uniform thickness, which simplifies the manufacturing process for the above-mentioned shared film layers, and accordingly, simplifies the manufacturing process for the display substrate 100.

It will be noted that the thicknesses of the first red sub-micro cavity adjustment layer 2412R, the first green sub-micro cavity adjustment layer 2412G, and the first blue sub-micro cavity adjustment layer 2412B have a relatively small effect on the electrical performance of the light-emitting device layer 2 in the display substrate 100, and adjusting the thicknesses of the first red sub-micro cavity adjustment layer 2412R, the first green sub-micro cavity adjustment layer 2412G, and the first blue sub-micro cavity adjustment layer 2412B to adjust the lengths of the plurality of sub-microcavities A1 can reduce the effect on the electrical performance of the light-emitting device layer 2 in the display substrate 100.

It can be understood that any one of the first red sub-micro cavity adjustment layer 2412R, the first green sub-micro cavity adjustment layer 2412G, and the first blue sub-micro cavity adjustment layer 2412B may include a single film layer; alternatively, any one of the first red sub-micro cavity adjustment layer 2412R, the first green sub-micro cavity adjustment layer 2412G, and the first blue sub-micro cavity adjustment layer 2412B may include multiple film layers stacked in a sequence.

In some examples, the first red sub-micro cavity adjustment layer 2412R and the first green sub-micro cavity adjustment layer 2412G each include a single film layer. For example, as shown in FIG. 6, the first red sub-micro cavity adjustment layer 2412R includes a red hole transport layer 2412R-1, and the first green sub-micro cavity adjustment layer 2412G includes a green hole transport layer 2412G-1.

For example, the red hole transport layer 2412R-1 can reduce an injection barrier of holes, facilitating the transport and injection of the holes from the second auxiliary layer 24 into the second red light-emitting layer 25R, which in turn can increase the accumulation of the holes in the second red light-emitting layer 25R, and improve the luminous efficacy and the luminous lifetime of the second red light-emitting layer 25R; and the green hole transport layer 2412G-1 can reduce an injection barrier of holes, facilitating the transport and injection of the holes from the second auxiliary layer 24 into the second green light-emitting layer 25G, which in turn can increase the accumulation of the holes in the second green light-emitting layer 25G, and improve the luminous efficacy and the luminous lifetime of the second green light-emitting layer 25G.

In some other embodiments, as shown in FIG. 3, the first red sub-micro cavity adjustment layer 2412R includes a red hole transport layer 2412R-1 and a red electron blocking layer 2412R-2 that are stacked in sequence along the direction away from the backplate 1; and the first green sub-micro cavity adjustment layer 2412G includes a green hole transport layer 2412G-1 and a green electron blocking layer 2412G-2 that are stacked in sequence along the direction away from the backplate 1.

For example, the red hole transport layer 2412R-1 can reduce an injection barrier of holes, facilitating the transport and injection of the holes from the second auxiliary layer 24 into the second red light-emitting layer 25R, which in turn can increase the accumulation of the holes in the second red light-emitting layer 25R, and improve the luminous efficacy and the luminous lifetime of the second red light-emitting layer 25R; and the green hole transport layer 2412G-1 can reduce an injection barrier of holes, facilitating the transport and injection of the holes from the second auxiliary layer 24 into the second green light-emitting layer 25G, which in turn can increase the accumulation of the holes in the second green light-emitting layer 25G, and improve the luminous efficacy and the luminous lifetime of the second green light-emitting layer 25G.

For example, the red electron blocking layer 2412R-2 is used to block electrons and/or excitons from escaping from the second red light-emitting layer 25R, which can restrict the electrons and/or excitons within the second red light-emitting layer 25R, thereby increasing the concentration of the electrons and/or excitons in the second red light-emitting layer 25R, and thereby increasing the luminous brightness and luminous efficiency of the second red light-emitting layer 25R; and the green electron blocking layer 2412G-2 is used to block electrons and/or excitons from escaping from the second green light-emitting layer 25G, which can restrict the electrons and/or excitons within the second green light-emitting layer 25G, thereby increasing the concentration of the electrons and/or excitons in the second green light-emitting layer 25G, and thereby increasing the luminous brightness and luminous efficiency of the second green light-emitting layer 25G.

In some examples, the red hole transport layer 2412R and the green hole transport layer 2412G are each used to adjust a length of a sub-micro cavity A1.

It can be understood that in a case where the thicknesses of the other film layers (e.g., the first auxiliary layer 22, the first light-emitting layers 23, and so forth) remain unchanged, by varying the thicknesses of the red hole transport layer 2412R-1 and the green hole transport layer 2412G-1, the lengths of the corresponding red sub-micro cavity A1-R and green sub-micro cavity A1-G can be varied.

For example, the length of the red sub-micro cavity A1-R can be varied by varying the thickness of the red hole transport layer 2412R-1, thereby, the red light can be made to generate a micro cavity effect in the red sub-micro cavity A1-R, and the brightness and color purity of the red light can be increased. Further, the wavelength of the light capable of generating the micro cavity effect in the red sub-micro cavity A1-R can also be varied, so that the color of the light emitted in the red sub-micro cavity A1-R can be adjusted. The length of the green sub-micro cavity A1-G can be varied by varying the thickness of the green hole transport layer 2412G-1, thereby, the green light can be made to generate a micro cavity effect in the green sub-micro cavity A1-G, and the brightness and color purity of the green light can be increased. Further, the wavelength of the light capable of generating the micro cavity effect in the green sub-micro cavity A1-G can also be varied, so that the color of the light emitted in the green sub-micro cavity A1-G can be adjusted.

It will be noted that the first auxiliary layer 22 may include a single film layer or multiple film layers stacked in a sequence. In a case where the first auxiliary layer 22 includes multiple film layers, structures of the multiple film layer of the first auxiliary layer 22 may have a variety of options, and each of the film layers may have a different function, so as to make it possible for the first auxiliary layer 22 to have a variety of functions.

Figure 7:
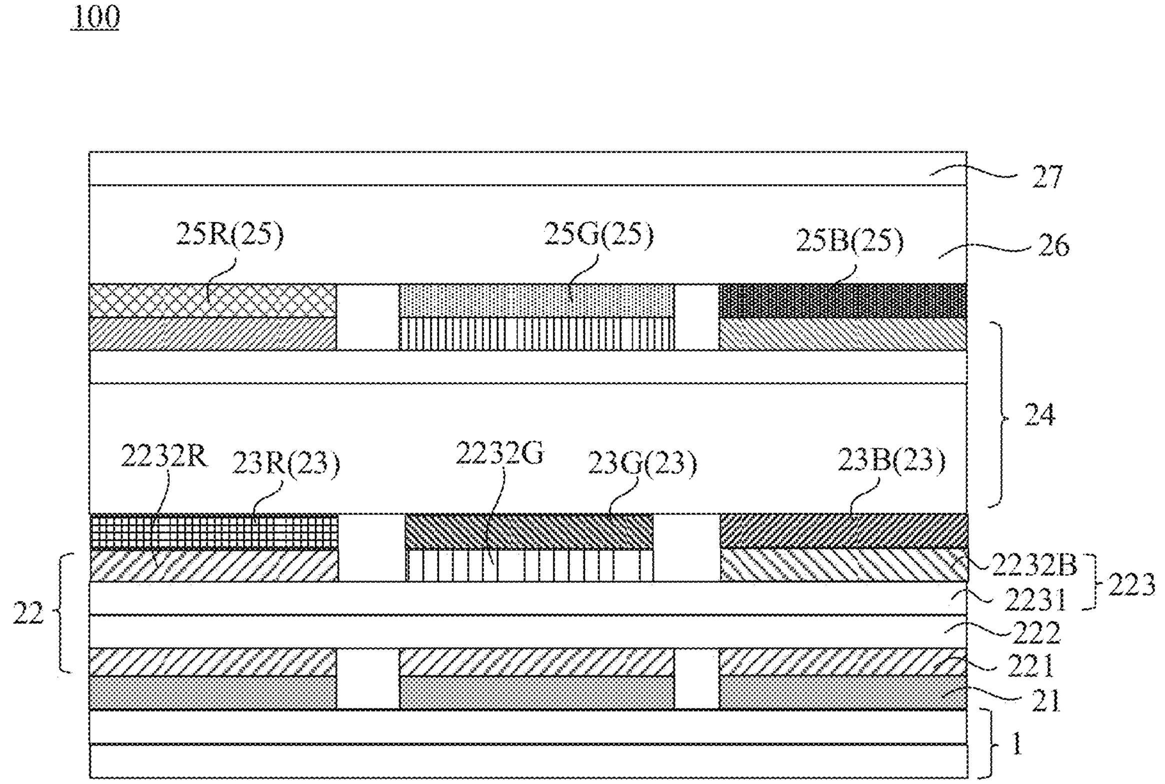
FIG. 7 is a structural diagram of still another display substrate, in accordance with some embodiments of the present disclosure.

In some embodiments, as shown in FIG. 7, the first auxiliary layer 22 includes a light-transmitting conductive layer 221, a hole injection layer 222 and a second micro cavity adjustment layer 223 that are stacked in sequence along the direction away from the backplate 1.

For example, the light-transmitting conductive layer 221 has good light transmittance and electrical conductivity, and in a case of light rays directed to the light-transmitting conductive layer 221, the light rays can pass through the light-transmitting conductive layer 221 and be directed to the anode layer 21, and the anode layer 21 has good light reflection properties, so the light rays can be reflected at the anode layer 21.

For example, the light-transmitting conductive layer 221 may have a single-layer structure; alternatively, the light-transmitting conductive layer 221 may include multiple film layers stacked in sequence.

For example, the material of the light-transmitting conductive layer 221 may include indium tin oxide (ITO), indium zinc oxide (IZO) or the like.

For example, the thickness of the light-transmitting conductive layer 221 is less than or equal to 10 nm. For example, the thickness of the light-transmitting conductive layer 221 is in a range of 5 nm to 10 nm, inclusive.

For example, the thickness of the light-transmitting conductive layer 221 may be 5 nm, 6.5 nm, 8 nm, 9 nm, or 10 nm.

For example, the hole injection layer 222 can be formed by doping the material of the first hole transport layer 2231 described below with a P-type dopant (e.g., $MnO_3$, F4TCNQ (2-[4-(dicyanomethylidene)-2,3,5,6-tetrafluorocyclohexa-2, 5-dien-1-ylidene] propanedinitrile), or the like), with a doping ratio of the P-type dopant less than or equal to 5%. The thickness of the hole injection layer 222 is less than or equal to 10 nm.

For example, the doping ratio of the P-type dopant in the material of the first hole transport layer 2231 may be 1%, 2%, 3%, 4%, or 5%. The thickness of the hole injection layer 222 may be 1 nm, 3 nm, 5 nm, 8 nm, or 10 nm.

For example, the second micro cavity adjustment layer 223 is used to adjust the length of the micro cavity A. By adjusting thicknesses of portions of the second micro cavity adjustment layer 223 that are respectively opposite to the second red light-emitting layer 25R, the second green light-emitting layer 25G and the second blue light-emitting layer 25B, the micro cavity effect can be generated on light of a corresponding color in the red sub-micro cavity A1-R, on light of a corresponding color in the green sub-micro cavity A1-G, and on light of a corresponding color in the blue sub-micro cavity A1-B, improving the color purity and luminous brightness of the light rays emitted from the sub-microcavities A1.

In some examples, as shown in FIG. 7, the second micro cavity adjustment layer 223 includes a first hole transport layer 2231, second red sub-micro cavity adjustment layers 2232R, second green sub-micro cavity adjustment layers 2232G, and second blue sub-micro cavity adjustment layers 2232B. Here, the second red sub-micro cavity adjustment layers 2232R are each provided between the first hole transport layer 2231 and a first red light-emitting layer 23R. The second green sub-micro cavity adjustment layers 2232G are each provided between the first hole transport layer 2231 and a first green light-emitting layer 23G. The second blue sub-micro cavity adjustment layers 2232B are each provided between the first hole transport layer 2231 and a first blue light-emitting layer 23B.

In some examples, the first hole transport layer 2231 is provided as a whole layer and has an adjustable thickness.

By providing the first hole transport layer 2231 as a whole layer, the manufacturing process of the display substrate 100 may be simplified.

By adjusting the thickness of the first hole transport layer 2231, the length of the micro cavity A can be adjusted, so that the micro cavity effect can be generated on light of a corresponding color in the red sub-micro cavity A1-R, on light of a corresponding color in the green sub-micro cavity A1-G, and on light of a corresponding color in the blue sub-micro cavity A1-B, improving the color purity and luminous brightness of the light rays emitted from the sub-microcavities A1.

For example, the HOMO energy level of the material of the hole injection layer 222 and the HOMO energy level of the material of the first hole transport layer 2231 increase in sequence, and such a configuration can reduce an injection barrier of holes and increase the mobility of the holes, which is conducive to the transport and injection of the holes from the anode layer 21 into the first light-emitting layers 23 of corresponding colors, respectively, thereby increasing the accumulation of the holes in the first light-emitting layers 23, as well as the luminous efficacy and the luminous lifetime of the first light-emitting layers 23.

For example, the HOMO energy level of the material of the first hole transport layer 2231 is in a range of −5.2 eV to −5.6 eV, inclusive. For example, the HOMO energy level of the material of the first hole transport layer 2231 may be −5.2 eV, −5.3 eV, −5.4 eV, −5.5 eV, or −5.6 eV.

For example, the material of the first hole transport layer 2231 includes a carbazole-like material with a high hole mobility. The first hole transport layer 2231 may be formed by an evaporation process.

For example, the second red sub-micro cavity adjustment layer 2232R is used to lower a barrier for the transport of holes from the first hole transport layer 2231 to the first red light-emitting layer 23R; the second green sub-micro cavity adjustment layer 2232G is used to lower a barrier for the transport of holes from the first hole transport layer 2231 to the first green light-emitting layer 23G; and the second blue sub-micro cavity adjustment layer 2232B is used to lower a barrier for the transport of holes from the first hole transport layer 2231 to the first blue light-emitting layer 23B. This can increase the migration efficiency of the holes being transported to the first light-emitting layers 23, increase the amount of the holes in the first light-emitting layers 23, and increase the luminous brightness and luminous efficiency of the first light-emitting layers 23.

For example, the T1 of the material of the second red sub-micro cavity adjustment layer 2232R, the T1 of the material of the second green sub-micro cavity adjustment layer 2232G, and the T1 of the material of the second blue sub-micro cavity adjustment layer 2232B are each higher than the T1 of a luminescent material of a first light-emitting layer 23 of a corresponding color, which prevents electrons and/or excitons from escaping from the first light-emitting layer 23, and maintains the concentration of the electrons and/or excitons in the first light-emitting layer 23, ensuring the luminous efficiency of the first light-emitting layer 23.

For example, the T1 of the materials of the second red sub-micro cavity adjustment layer 2232R, the second green sub-micro cavity adjustment layer 2232G, and the second blue sub-micro cavity adjustment layer 2232B is higher than the T1 of the luminescent material of the first light-emitting layer 23 by at least 0.2 eV.

For example, the thicknesses of the second red sub-micro cavity adjustment layer 2232R, the second green sub-micro cavity adjustment layer 2232G, and the second blue sub-micro cavity adjustment layer 2232B are each individually adjustable. By individually adjusting the thicknesses of the second red sub-micro cavity adjustment layer 2232R, the second green sub-micro cavity adjustment layer 2232G, and the second blue sub-micro cavity adjustment layer 2232B, respectively, it is possible to adjust the micro cavity lengths of a corresponding red sub-micro cavity A1-R, a corresponding green sub-micro cavity A1-G, and a corresponding blue sub-micro cavity A1-B, so that a micro cavity effect can be generated on light of a corresponding color in the red sub-micro cavity A1-R, on light of a corresponding color in the green sub-micro cavity A1-G, and on light of a corresponding color in the blue sub-micro cavity A1-B, and the color purity and luminous brightness of the light rays emitted from the sub-microcavities A1 can be improved.

For example, the thickness of the second blue sub-micro cavity adjustment layer 2232B is less than or equal to 10 nm.

For example, the thickness of the second blue sub-micro cavity adjustment layer 2232B may be 1 nm, 3 nm, 5 nm, 7 nm, or 10 nm.

Figure 8:
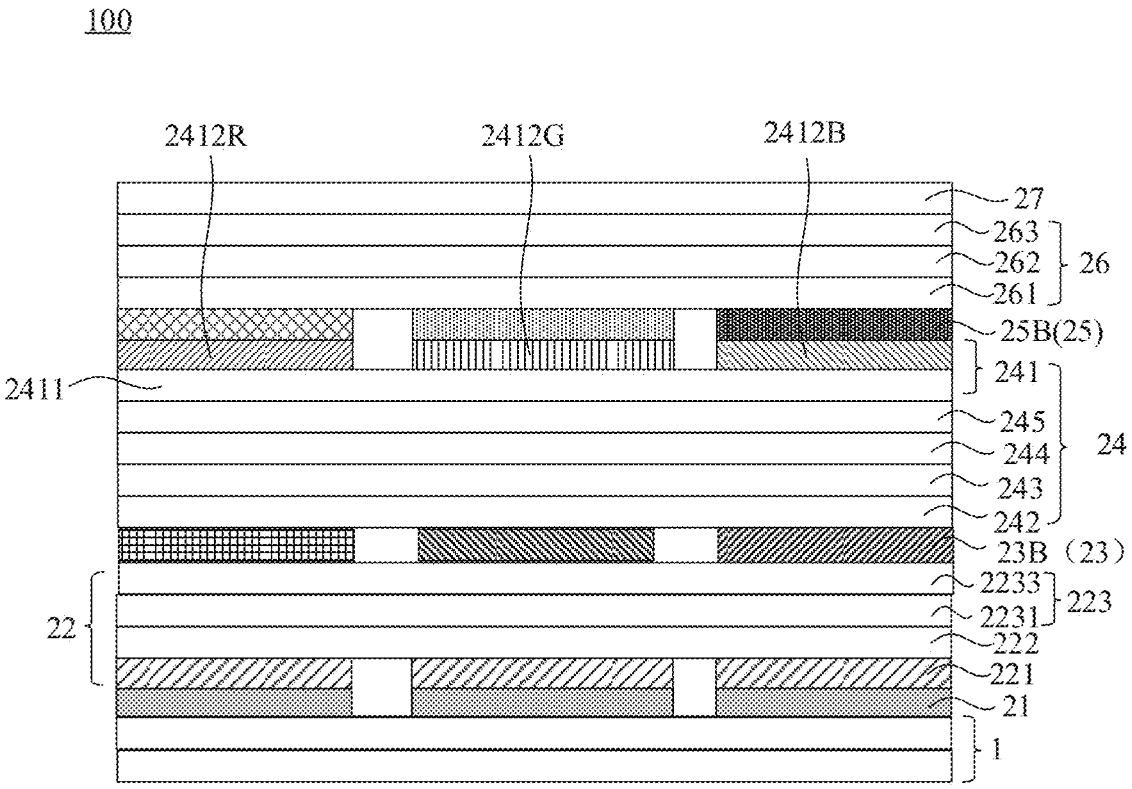
FIG. 8 is a structural diagram of still yet another display substrate, in accordance with some embodiments of the present disclosure.

In some other embodiments, the first auxiliary layer 22 includes multiple film layers with a structure different from that of the above-described film layers, and as shown in FIG. 8, the first auxiliary layer 22 includes the light-transmitting conductive layer 221, the hole injection layer 222, and a second micro cavity adjustment layer 223. The second micro cavity adjustment layer 223 includes the first hole transport layer 2231 and an electron blocking layer 2233.

For example, the second micro cavity adjustment layer 223 is used to adjust the length of the micro cavity A. By adjusting thicknesses of portions of the second micro cavity adjustment layer 223 that are respectively opposite to the second red light-emitting layer 25R, the second green light-emitting layer 25G and the second blue light-emitting layer 25B, the micro cavity effect can be generated on light of a corresponding color in the red sub-micro cavity A1-R, on light of a corresponding color in the green sub-micro cavity A1-G, and on light of a corresponding color in the blue sub-micro cavity A1-B, improving the color purity and luminous brightness of the light rays emitted from the sub-microcavities A1.

For example, the HOMO energy level of the material of the hole injection layer 222, the HOMO energy level of the material of the first hole transport layer 2231, and the HOMO energy level of the material of the electron blocking layer 2233 increase in sequence, and such a configuration can reduce an injection barrier of holes and increase the mobility of the holes, which is conducive to the transport and injection of the holes from the anode layer 21 into the first light-emitting layers 23, respectively, thereby increasing the accumulation of the holes in the first light-emitting layers 23, as well as the luminous efficacy and the luminous lifetime of the first light-emitting layers 23.

For example, the HOMO energy level of the material of the electron blocking layer 2233 is in a range of −5.5 eV to −5.9 eV, inclusive. For example, the HOMO energy level of the material of the electron blocking layer 2233 is −5.5 eV, −5.6 eV, −5.7 eV, −5.8 eV, or −5.9 eV.

For example, the T1 of the material of the electron blocking layer 2233 is greater than the T1 of the luminescent material in the first light-emitting layer 23, which prevents electrons and/or excitons from escaping from the first light-emitting layer 23, and maintains the concentration of the electrons and/or excitons in the first light-emitting layer 23, ensuring the luminous efficiency of the first light-emitting layer 23.

For example, the T1 of the material of the electron blocking layer 2233 is greater than the T1 of the luminescent material in the first light-emitting layer 23 by at least 0.2 eV.

In some examples, in the display substrate 100 provided in the above embodiments, the difference between the refractive indices of any two of film layers located between the anode layer 21 and the cathode layer 27 is less than or equal to 0.32. Such a configuration can make the refractive indices of any two of the film layers located between the anode layer 21 and the cathode layer 27 relatively close to each other, i.e., the difference between the refractive indices of any two of the film layers located between the anode layer 21 and the cathode layer 27 is small, so as to reduce the sudden change in the refractive indices of the film layers. In this way, the light-emitting device **2*a* has good light-output efficiency, reducing the dispersion of the light emitted by the light-emitting device 2*a***.

For example, as shown in FIG. 8, material types of the film layers between the anode layer 21 and the cathode layer 27 and the refractive index of each of the film layers to the blue light having a wavelength of 460 nm are shown in Table 1 below.

TABLE 1

| Film Layer Name | Material Type | Refractive Index |
|---|---|---|
| Hole Injection Layer | Carbazole-Like Doped Radialene | 1.74 |
| First Hole Transport Layer | Carbazole-Like | 1.74 |
| Electron Blocking Layer | Carbazole-Like | 1.87 |
| First Hole Blocking Layer | Triazine-Like | 1.88 |
| First Electron Transport Layer | Triazine-Like | 2.00 |
| First Charge Generating Layer | Phosphorus Oxide-Like | 1.82 |
| Second Charge Generating Layer | Carbazole-Like Doped Radialene | 1.74 |
| Second Hole Transport Layer | Carbazole-Like | 1.74 |
| Sub-Microcavity Adjustment Layer Of Each Color | Carbazole-Like | 1.87 |
| Second Hole Blocking Layer | Triazine-Like | 1.86 |
| Second Electron Transport Layer | Triazine-Like | 1.79 |
| Electron Injection Layer | Metal Complex | 1.68 |

As can be seen from Table 1, the difference between the refractive indices of any two of the film layers located between the anode layer 21 and the cathode layer 27 is less than or equal to 0.32, which means that the refractive indices of any two of the film layers located between the anode layer 21 and the cathode layer 27 are closer to each other. By selecting the material and refractive index of each of the film layers located between the anode layer 21 and the cathode layer 27, the difference between the refractive indices of any two of the film layers located between the anode layer 21 and the cathode layer 27 can be further reduced, so as to further reduce the sudden change in the refractive indices of the film layers. In this way, the light-emitting device 2*a* has good light-output efficiency, reducing the dispersion of the light emitted by the light-emitting device 2*a*.

Figure 9:
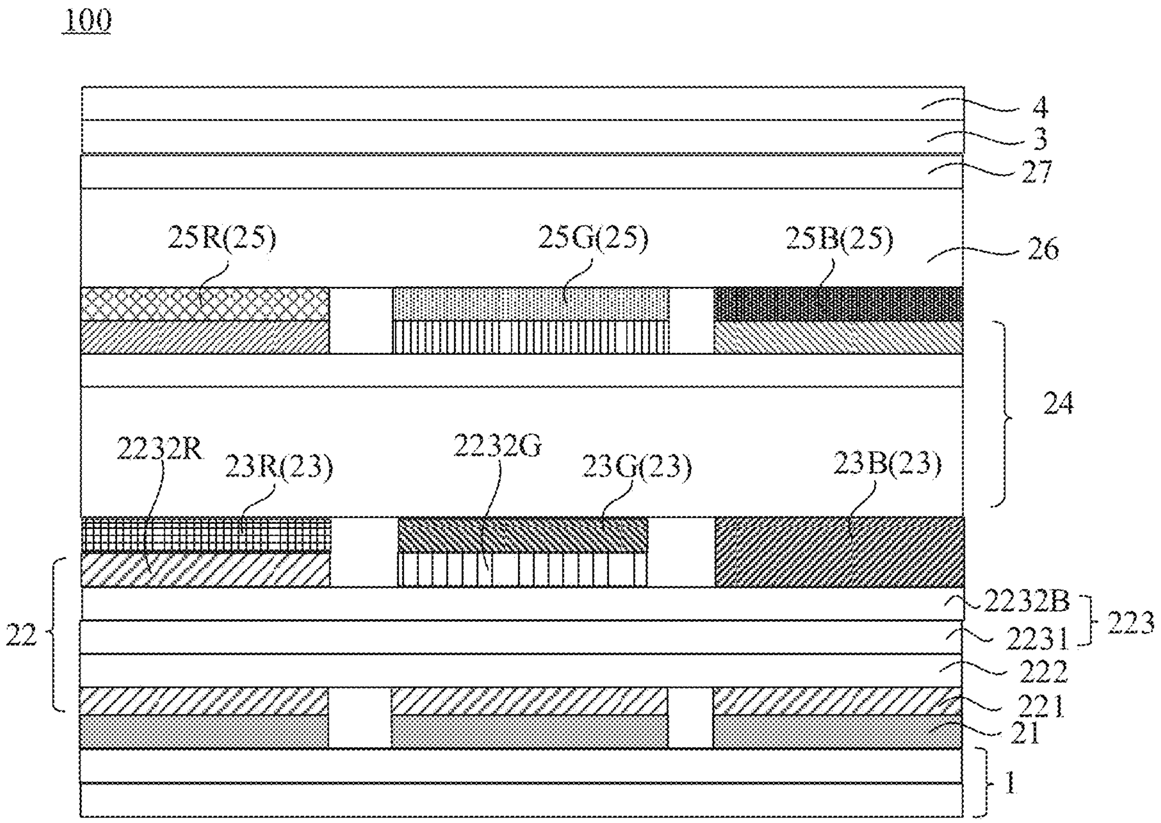
FIG. 9 is a structural diagram of still yet another display substrate, in accordance with some embodiments of the present disclosure.

In yet some other embodiments, the first auxiliary layer 22 includes multiple film layers with a structure different from the two structures of the above-described film layers, and as shown in FIG. 9, the first auxiliary layer 22 includes the light-transmitting conductive layer 221, the hole injection layer 222, and the second micro cavity adjustment layer 223 that are stacked in sequence in the direction away from the backplate 1.

The second micro cavity adjustment layer 223 includes the first hole transport layer 2231, a second blue sub-micro cavity adjustment layer 2232B, second red sub-micro cavity adjustment layers 2232R, and second green sub-micro cavity adjustment layers 2232G. The second blue sub-micro cavity adjustment layer 2232B is provided on a side of the first hole transport layer 2231 away from the backplate 1. The second red sub-micro cavity adjustment layers 2232R are each provided between the second blue sub-micro cavity adjustment layer 2232B and a first red light-emitting layer 23R. The second green sub-micro cavity adjustment layers 2232G are each provided between the second blue sub-micro cavity adjustment layer 2232B and a first green light-emitting layer 23G.

For example, the second micro cavity adjustment layer 223 is used to adjust the length of the micro cavity A. By adjusting thicknesses of portions of the second micro cavity adjustment layer 223 that are respectively opposite to the second red light-emitting layer 25R, the second green light-emitting layer 25G and the second blue light-emitting layer 25B, the micro cavity effect can be generated on light of a corresponding color in the red sub-micro cavity A1-R, on light of a corresponding color in the green sub-micro cavity A1-G, and on light of a corresponding color in the blue sub-micro cavity A1-B, improving the color purity and luminous brightness of the light rays emitted from the sub-microcavities A1.

For example, the second blue sub-micro cavity adjustment layer 2232B, the second red sub-micro cavity adjustment layer 2232R, and the second green sub-micro cavity adjustment layer 2232G are used to lower a barrier for the transport of holes from the first hole transport layer 2231 to the first red light-emitting layers 23R. Since the second blue sub-micro cavity adjustment layer 2232B is provided in a whole layer, providing the second red sub-micro cavity adjustment layer 2232R on the second blue sub-micro cavity adjustment layer 2232B can further reduce the barrier for the transport of holes from the first hole transport layer 2231 to the first red light-emitting layer 23R, and providing the second green sub-micro cavity adjustment layer 2232G on the second blue sub-micro cavity adjustment layer 2232B can further reduce the barrier for the transport of holes from the first hole transport layer 2231 to the first green light-emitting layer 23G. In this way, the mobility of the holes is further increased, and the luminous brightness and luminous efficiency of the first light-emitting layers 23 are improved.

For example, the thickness of the second blue sub-micro cavity adjustment layer 2232B, the thickness of the second red sub-micro cavity adjustment layer 2232R, and the thickness of the second green sub-micro cavity adjustment layer 2232G are individually adjustable.

For example, in a case where each color of light generates a micro cavity effect in a corresponding sub-micro cavity A1, the blue sub-micro cavity A1-B has the smallest length. By providing the second blue sub-micro cavity adjustment layer 2232B as a whole layer, after adjusting the thickness of the second blue sub-micro cavity adjustment layer 2232B to make the blue light generate a micro cavity effect, as shown in FIG. 9, the amount of adjustment of the thicknesses of the second red sub-micro cavity adjustment layer 2232R and the second green sub-micro cavity adjustment layer 2232G can be reduced and the fabrication process for the second red sub-micro cavity adjustment layer 2232R and the second green sub-micro cavity adjustment layer 2232G in the display substrate 100 can be simplified.

It will be noted that it is also possible to adjust a position of the peak in the spectrum of light rays emitted from the sub-micro cavity A1 by adjusting the thicknesses of the second blue sub-micro cavity adjustment layer 2232B, the second red sub-micro cavity adjustment layer 2232R, and the second green sub-micro cavity adjustment layer 2232G of the display substrate 100, so that it is possible to adjust colors of the light rays.

In addition, the thickness of the hole injection layer 222, the thickness of the first hole transport layer 2231, and the thickness of the electron blocking layer 2233 in the above embodiments are individually adjustable, and the hole injection layer 222, the first hole transport layer 2231, and the electron blocking layer 2233 can each be used to adjust the length of the sub-micro cavity A1, so as to improve the color purity and luminous brightness of light rays emitted from the sub-micro cavity A1. Further, it is also possible to adjust the position of the peak in the spectrum of the light rays emitted from the sub-micro cavity A1 by adjusting the length of the sub-micro cavity A1, so that the color of the light rays can be adjusted.

It will be noted that any one of the second auxiliary layer 24 and the third auxiliary layer 26 may include a single film layer or multiple film layers stacked in a sequence. In a case where any one of the second auxiliary layer 24 and the third auxiliary layer 26 includes multiple film layers, each of the film layers may have a different function, so as to make it possible for the second auxiliary layer 24 and the third auxiliary layer 26 to have a variety of functions.

In some examples, as shown in FIG. 8, the second auxiliary layer 24 further includes: a first hole blocking layer 242, a first electron transport layer 243, a first charge generating layer 244, and a second charge generating layer 245 that are located on a side of the first micro cavity adjustment layer 241 proximate to the backplate 1 and arranged in a sequence along the direction away from the backplate 1.

In this case, as shown in FIG. 8, the above-described film layers that are located between the first auxiliary layer 22 and the third auxiliary layer 26, and opposite to the first blue light-emitting layers 23B includes: the first blue light-emitting layers 23B, the first hole blocking layer 242, the first electron transport layer 243, the first charge generating layer 244, the second charge generating layer 245, the second hole transport layer 2411, the first blue sub-micro cavity adjustment layer 2412B, and the second blue light-emitting layers 25B. The sum of the optical thicknesses of the aforesaid film layers located between the first auxiliary layer 22 and the third auxiliary layer 26 and opposite to the first blue light-emitting layers 23B is the sum of the optical thicknesses of the first blue light-emitting layer 23B, the first hole blocking layer 242, the first electron transport layer 243, the first charge generating layer 244, the second charge generating layer 245, the second hole transport layer 2411, the first blue sub-micro cavity adjustment layer 2412B and the second blue light-emitting layer 25B. The sum of the actual thicknesses of the aforesaid film layers located between the first auxiliary layer 22 and the third auxiliary layer 26 and opposite to the first blue light-emitting layers 23B is the sum of the actual thicknesses of the first blue light-emitting layer 23B, the first hole blocking layer 242, the first electron transport layer 243, the first charge generating layer 244, the second charge generating layer 245, the second hole transport layer 2411, the first blue sub-micro cavity adjustment layer 2412B and the second blue light-emitting layer 25B.

For example, the absolute value of the HOMO energy level of the material of the first hole blocking layer 242 is greater than the absolute value of the HOMO energy level of the material of the first light-emitting layer 23. The first hole blocking layer 242 is used to prevent holes and/or excitons from escaping from the first light-emitting layer 23.

For example, the absolute value of the HOMO energy level of the material of the first hole blocking layer 242 is greater than the absolute value of the HOMO energy level of the material of the first light-emitting layer 23 by at least 0.2 eV.

For example, the T1 of the material of the first hole blocking layer 242 is higher than the T1 of the luminescent material contained in the first light-emitting layer 23.

For example, the T1 of the material of the first hole blocking layer 242 is higher than the T1 of the luminescent material contained in the first light-emitting layer 23 by at least 0.2 eV.

For example, the material of the first hole blocking layer 242 includes a triazine-like material or the like.

For example, the thickness of the first hole blocking layer 242 is less than or equal to 10 nm. For example, the thickness of the first hole blocking layer 242 is 1 nm, 3 nm, 5 nm, 8 nm, or 10 nm.

For example, the material of the first electron transport layer 243 includes at least one of: a thiophene-like material, an imidazole-like material, an azine-like derivative material, and quinoline lithium. The first electron transport layer 243 may be obtained by blending the thiophene-like, imidazole-like, or azine-like derivative material, with the quinoline lithium, where the mass proportion of the quinoline lithium is in a range of 30% to 70%, inclusive.

For example, the mass proportion of the quinoline lithium is 30%, 40%, 50%, 60%, or 70%.

For example, the thickness of the first electron transport layer 243 is in a range of 15 nm to 50 nm, inclusive. For example, the thickness of the first electron transport layer 243 is 15 nm, 23 nm, 35 nm, 40 nm, or 50 nm.

For example, the first charge generating layer 244 and the second charge generating layer 245 are used to cause a first light-emitting layer 23 and a second light-emitting layer 25 in the light-emitting device layer 2 to form a tandem light emission, so as to increase the overall luminous brightness of the display substrate 100.

For example, the first charge generating layer 244 can be formed by doping a low-function metal (e.g., Li (Lithium), Yb (Ytterbium), Ca (Calcium), or the like) in the material of the first electron transport layer 243, with a doping ratio less than or equal to 5%. The thickness of the first charge generating layer 244 is less than or equal to 10 nm.

For example, the doping ratio of the low-function metal may be 1%, 2%, 3%, 4%, or 5%. The thickness of the first charge generating layer 244 may be 1 nm, 3 nm, 5 nm, 8 nm, or 10 nm.

For example, the second charge generating layer 245 can be formed by doping the material of the second hole transport layer 2411 with a P-type dopant (e.g., $MnO_3$, F4TCNQ, or the like), with a doping ratio less than or equal to 5%. The thickness of the second charge generating layer 245 is less than or equal to 10 nm.

For example, the doping ratio of the P-type dopant may be 1%, 2%, 3%, 4%, or 5%. The thickness of the second charge generating layer 245 may be 1 nm, 3 nm, 5 nm, 8 nm, or 10 nm.

Here, the first charge generating layer 244 may also be referred to as an N-type charge generating layer (N-CGL), and the second charge generating layer 245 may also be referred to as a P-type charge generating layer (P-CGL).

In some examples, as shown in FIG. 8, the third auxiliary layer 26 includes a second hole blocking layer 261, a second electron transport layer 262, and an electron injection layer 263 that are stacked in sequence along the direction away from the backplate 1.

For example, the absolute value of the HOMO energy level of the material of the second hole blocking layer 261 is greater than the absolute value of the HOMO energy level of the material of the second light-emitting layer 25. The second hole blocking layer 261 is used to prevent holes and/or excitons from escaping from the second light-emitting layer 25.

For example, the absolute value of the HOMO energy level of the material of the second hole blocking layer 261 is greater than the absolute value of the HOMO energy level of the material of the second light-emitting layer 25 by at least 0.2 eV.

For example, the T1 of the material of the second hole blocking layer 261 is higher than the T1 of the luminescent material contained in the second light-emitting layer 25.

For example, the T1 of the material of the second hole blocking layer 261 is higher than the T1 of the luminescent material contained in the second light-emitting layer 25 by at least 0.2 eV.

For example, the material of the second hole blocking layer 261 includes a triazine-like material or the like.

For example, the thickness of the second hole blocking layer 261 is less than or equal to 10 nm. For example, the thickness of the second hole blocking layer 261 is 1 nm, 3 nm, 5 nm, 8 nm, or 10 nm.

For example, the material of the second electron transport layer 262 includes at least one of: a thiophene-like material, an imidazole-like material, an azine-like derivative material, and quinoline lithium. The second electron transport layer 262 may be obtained by blending the thiophene-like, imidazole-like, or azine-like derivative material, with the quinoline lithium, where the mass proportion of the quinoline lithium is in a range of 30% to 70%, inclusive.

For example, the mass proportion of the quinoline lithium is 30%, 40%, 50%, 60%, or 70%.

For example, the thickness of the second electron transport layer 262 is in a range of 15 nm to 50 nm, inclusive. For example, the thickness of the second electron transport layer 262 is 15 nm, 23 nm, 35 nm, 40 nm, or 50 nm.

For example, the electron injection layer 263 is used to reduce the injection barrier of electrons, which facilitates the transport and injection of the electrons from the cathode layer 27 into the second light-emitting layer 25, which in turn can increase the accumulation of electrons in the second light-emitting layer 25, and improve the luminous efficacy and luminous lifetime of the second light-emitting layer 25.

For example, the material of the electron injection layer 263 includes LiF (Lithium Fluoride), Yb (Ytterbium), or Ca (Calcium). The electron injection layer 263 may be formed by an evaporation process.

For example, the thickness of the electron injection layer 263 is in a range of 0.5 nm to 2 nm, inclusive. For example, the thickness of the electron injection layer 263 may be 0.5 nm, 0.8 nm, 1.2 nm, 1.7 nm, or 2 nm.

In some examples, as shown in FIG. 9, the display substrate 100 further includes an optical covering layer 3 and/or an encapsulating layer 4 that are stacked on the cathode layer 27 in sequence.

For example, the material of the optical covering layer 3 includes an organic material with a high refractive index. For example, the optical covering layer 3 has a refractive index greater than 1.9% to light having a wavelength of 530 nm.

For example, the thickness of the optical covering layer 3 is less than or equal to 100 nm. For example, the thickness of the optical covering layer 3 may be 10 nm, 30 nm, 50 nm, 80 nm, or 100 nm.

For example, the encapsulation layer 4 may prevent the film layers (e.g., the first light-emitting layers 23, the second light-emitting layers 25, etc.) in the display substrate 100 from coming into contact with water and oxygen in air, so as to reduce the aging rate of the aforesaid film layers, and to prolong the service life of the display substrate 100.

For example, the encapsulation type of the encapsulation layer 4 includes: sealant encapsulation or film encapsulation, etc.

Figure 10:
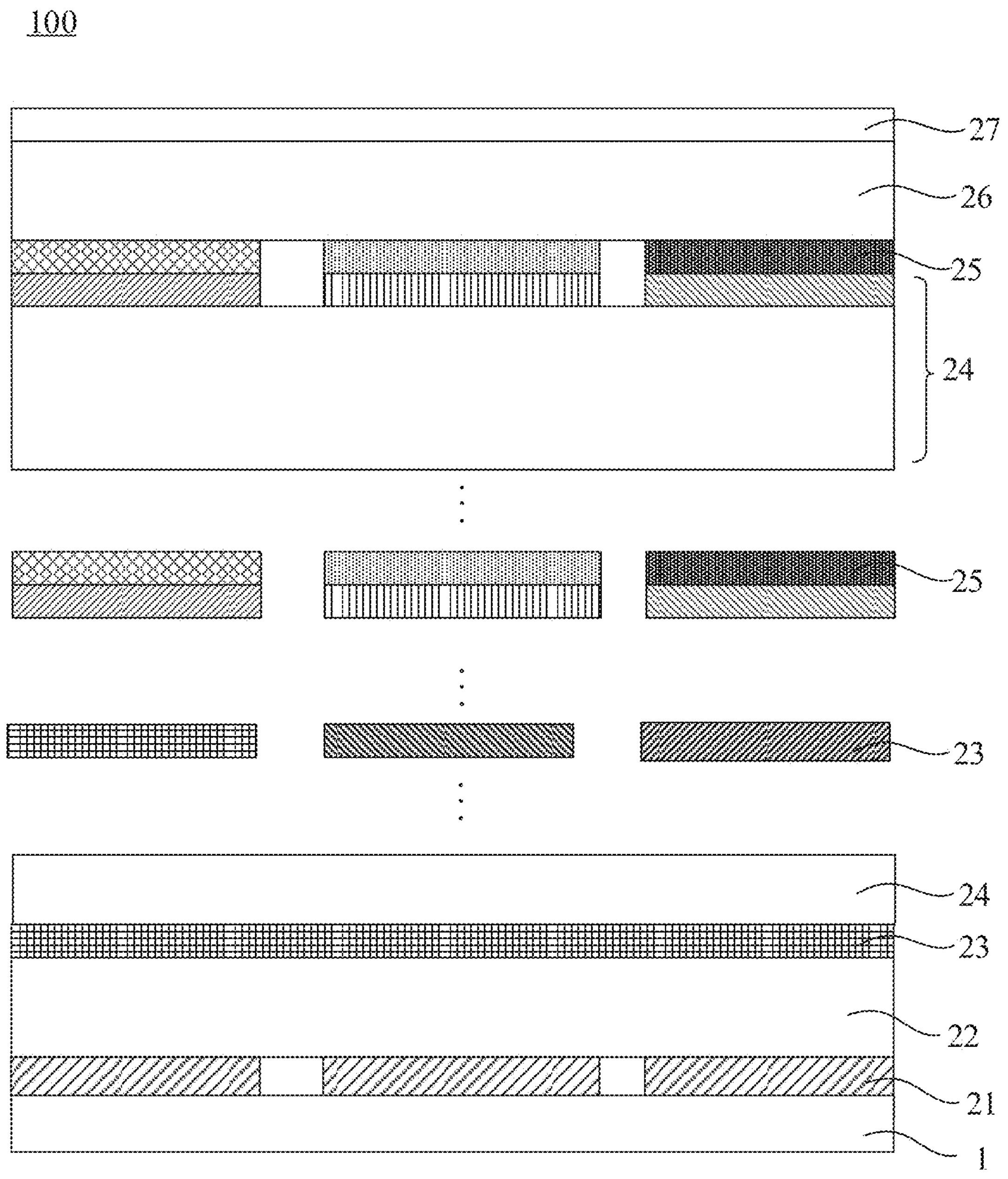
FIG. 10 is a structural diagram of still yet another display substrate, in accordance with some embodiments of the present disclosure.

In some examples, as shown in FIG. 10, there exist multiple second auxiliary layers 24, and any two adjacent second auxiliary layers 24 are provided with a plurality of first light-emitting layers 23 of at least two different colors or a plurality of second light-emitting layers 25 of at least two different colors therebetween.

For example, the number of the second auxiliary layers 24 is 2, 3, 4, 5 or 6; or the number of first light-emitting layers 23 corresponding to one light-emitting device 2*a* is 2, 3, 4, 5 or 6; or the number of second light-emitting layers 25 corresponding to one light-emitting device 2*a* is 2, 3, 4, 5 or 6.

By providing the plurality of first light-emitting layers 23, the total intensity of light that can be emitted by the first light-emitting layers 23 can be increased, which in turn can increase the intensity of the excitation light of the second light-emitting layers 25, increasing the luminous brightness of the display substrate 100.

By providing the plurality of second light-emitting layers 25, the total intensity of light that can be emitted by the second light-emitting layers 25 can be increased, which can increase the absorption of the light emitted from the first light-emitting layers 23 by the second light-emitting layers 25, which in turn can increase the intensity of the excitation light of the second light-emitting layers 25, increasing the luminous brightness of the display substrate 100.

By providing the plurality of second auxiliary layers 24, it may be ensured that holes and electrons can be transported to the pluralities of first light-emitting layers 23 and second light-emitting layers 25 to generate excitons, thereby causing the first light-emitting layers 23 and second light-emitting layers 25 to emit light.

The inventors of the present disclosure have verified the color purity and luminous efficiency of the display substrate 100 in the present disclosure.

Verification Example 1, Which Includes Comparison 1 and Embodiment 1

Comparison 1 provides a first display substrate which has red light-emitting devices (R light-emitting devices), green light-emitting devices (G light-emitting devices), and blue light-emitting devices (B light-emitting devices). The display substrate includes an anode layer, a light-transmitting conductive layer, a hole injection layer, a hole transport layer, an electron blocking layer, light-emitting layers (e.g., red light-emitting layers, green light-emitting layers, and blue light-emitting layers), a hole blocking layer, an electron transport layer, an electron injection layer, and a cathode layer, which are stacked in a sequence.

In the first display substrate, a red light-emitting layer in the red light-emitting device includes a red host material and a red fluorescent material containing boron element, with the mass proportion of the red fluorescent material being 5%; a green light-emitting layer in the green light-emitting device includes a green host material and a green fluorescent material having multiple resonance (MR) property, with the mass proportion of the green fluorescent material being 5%; and a blue light-emitting layer in the blue light-emitting device includes a blue host material and a deep-blue fluorescent material, with the mass proportion of the deep-blue fluorescent material being 1%.

The thickness of each film layer corresponding to the light-emitting devices in the first display substrate in Comparison 1 is shown in Table 2 below.

TABLE 2

| Items Of The First Display Substrate | R Light-Emitting Device | G Light-Emitting Device | B Light-Emitting Device |
|---|---|---|---|
| Thickness Of Anode Layer (nm) | 100 | 100 | 100 |
| Thickness Of Light-Transmitting Conductive Layer (nm) | 8 | 8 | 8 |
| Thickness Of Hole Injection Layer (nm) | 10 | 10 | 10 |
| Thickness Of Hole Transport Layer (nm) | 15 | 15 | 15 |
| Thickness Of Electron Blocking Layer (nm) | 5 | 5 | 5 |
| Thickness Of Light-Emitting Layer (nm) | 20 | 30 | 20 |
| Thickness Of Hole Blocking Layer (nm) | 10 | 10 | 5 |
| Thickness Of Electron Transport Layer (nm) | 35 | 35 | 35 |
| Thickness Of Electron Injection Layer (nm) | 1 | 1 | 1 |
| Thickness Of Cathode Layer (nm) | 15 | 15 | 15 |

Comparison 1 provides a second display substrate having the same structure as the first display substrate.

In the second display substrate, a red light-emitting layer in the red light-emitting device includes a conventional P-type red host material and a red luminescent material having thermally activated delayed fluorescence (TADF) property, with the mass proportion of the red luminescent material being 30%; a green light-emitting layer in the green light-emitting layer includes a conventional P-type green host material and a green luminescent material having TADF property, with the mass proportion of the green luminescent material being 30%; and a blue light-emitting layer in the blue light-emitting layer includes a blue host material and a blue fluorescent material containing boron element, with the mass proportion of the blue fluorescent material being 1%.

The thickness of each film layer corresponding to the light-emitting devices in the second display substrate in Comparison 1 is shown in Table 3 below.

TABLE 3

| Items Of The Second Display Substrate | R Light-Emitting Device | G Light-Emitting Device | B Light-Emitting Device |
|---|---|---|---|
| Thickness Of Light-Transmitting Conductive Layer (nm) | 70 | 70 | 70 |
| Thickness Of Hole Injection Layer (nm) | 10 | 10 | 10 |
| Thickness Of Hole Transport Layer (nm) | 100 | 100 | 100 |
| Thickness Of Electron Blocking Layer (nm) | 5 | 5 | 5 |
| Thickness Of Light-Emitting Layer (nm) | 20 | 30 | 20 |
| Thickness Of Hole Blocking Layer (nm) | 5 | 5 | 5 |
| Thickness Of Electron Transport Layer (nm) | 35 | 35 | 35 |
| Thickness Of Electron Injection Layer (nm) | 1 | 1 | 1 |
| Thickness Of Cathode Layer (nm) | 100 | 100 | 100 |

Embodiment 1 provides a display substrate 100 which has red light-emitting devices (R light-emitting devices), green light-emitting devices (G light-emitting devices), and blue light-emitting devices (B light-emitting devices). The display substrate 100 includes: an anode layer, a light-transmitting conductive layer, a hole injection layer, a first hole transport layer, an electron blocking layer, first light-emitting layers, a first hole blocking layer, a first electron transport layer, a first charge generating layer, a second charge generating layer, a second hole transport layer, sub-micro cavity adjustment layers of respective colors, second light-emitting layers of respective colors, a second hole blocking layer, a second electron transport layer, an electron injection layer, and a cathode layer.

In Embodiment 1, the material of the first light-emitting layer 23 is the same as the material of the light-emitting layer of the second display substrate in Comparison 1; and the material of the second light-emitting layer 25 is the same as the material of the light-emitting layer of the first display substrate in Comparison 1.

The thickness of each film layer corresponding to the light-emitting devices in the display substrate 100 in Embodiment 1 is shown in Table 4 below.

TABLE 4

| Item | R Light-Emitting Device | G Light-Emitting Device | B Light-Emitting Device |
|---|---|---|---|
| Thickness Of Anode Layer (nm) | 100 | 100 | 100 |
| Thickness Of Light-Transmitting Conductive Layer (nm) | 8 | 8 | 8 |
| Thickness Of Hole Injection Layer (nm) | 10 | 10 | 10 |
| Thickness Of First Hole Transport Layer (nm) | 20 | 20 | 20 |
| Thickness Of Electron Blocking Layer (nm) | 5 | 5 | 5 |
| Thickness Of First Light-Emitting Layer (nm) | 20 | 30 | 20 |
| Thickness Of First Hole Blocking Layer (nm) | 8 | 8 | 8 |
| Thickness Of First Electron Transport Layer (nm) | 12 | 12 | 12 |
| Thickness Of First Charge Generating Layer (nm) | 10 | 10 | 10 |
| Thickness Of Second Charge Generating Layer (nm) | 10 | 10 | 10 |
| Thickness Of Second Hole Transport Layer (nm) | 35 | 35 | 35 |
| Thickness Of Sub-Microcavity Adjustment Layer Of Each Color (nm) | 15 | 15 | 15 |
| Thickness Of Second Light-Emitting Laver (nm) | 20 | 30 | 20 |
| Thickness Of Second Hole Blocking Layer (nm) | 5 | 5 | 5 |
| Thickness Of Second Electron Transport Layer (nm) | 35 | 35 | 35 |
| Thickness Of Electron Injection Layer (nm) | 1 | 1 | 1 |
| Thickness Of Cathode Layer (nm) | 15 | 15 | 15 |

Here, in Comparison 1 and Embodiment 1, the doping ratio of the P-type of the hole injection layer is 3%, the material of the cathode layer is a magnesium-silver alloy, with the mass ratio of magnesium and silver in the magnesium-silver alloy being 1:9, and the material of the electron transport layer is (8-hydroxy quinoline) lithium.

Figure 11:
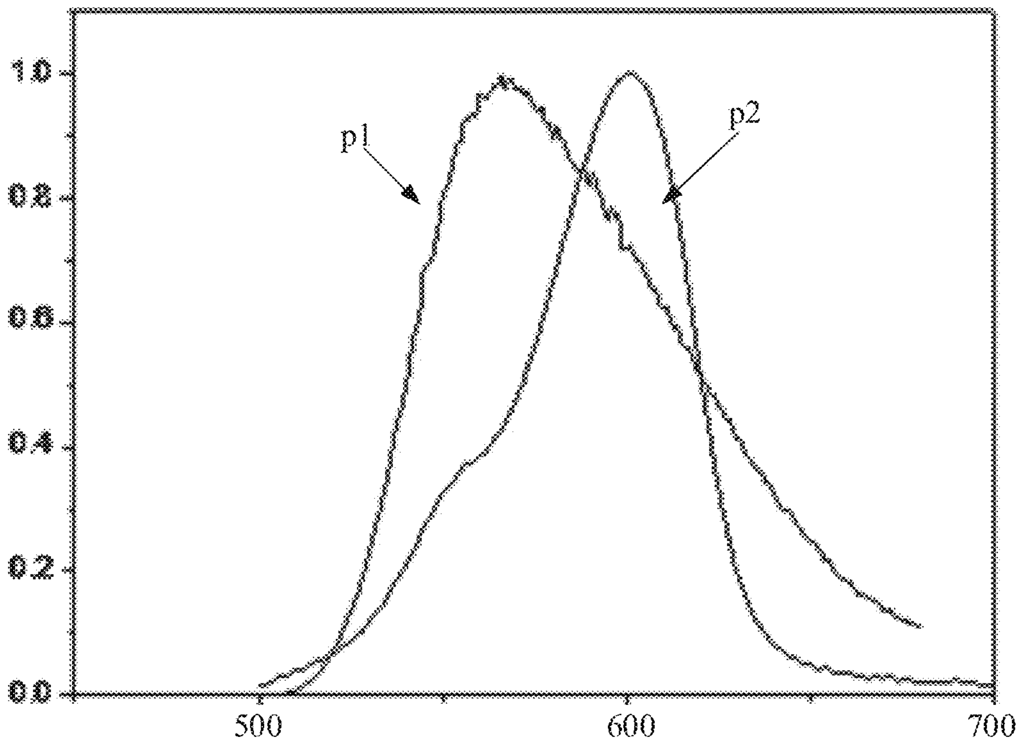
FIG. 11 is a diagram showing spectrum of some of light-emitting layers in Validation Example 1.
Figure 12:
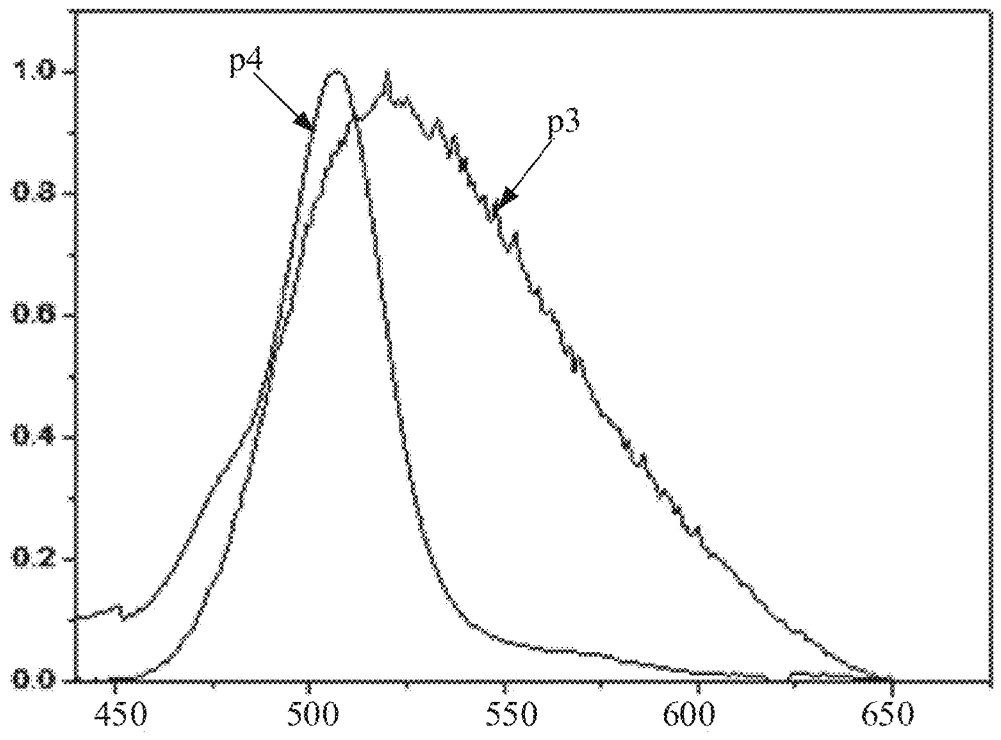
FIG. 12 is a diagram showing spectrum of some other of the light-emitting layers in Validation Example 1.

As shown in FIGS. 11 and 12, the horizontal coordinate of the curves is the wavelength in units of nanometer (nm), and the vertical coordinate of the curves is the relative intensity of the spectrum. As shown in FIG. 11, the emission spectrum p1 of the luminescent material of the red light-emitting layer of the second display substrate overlaps with the absorption spectrum p2 of the luminescent material of the red light-emitting layer of the first display substrate, in Comparison 1. As shown in FIG. 12, the emission spectrum p3 of the luminescent material of the green light-emitting layer of the second display substrate overlaps with the absorption spectrum p4 of the luminescent material of the green light-emitting layer of the first display substrate, in Comparison 1.

The comparative relationship between the first display substrate of Comparison 1 and the display substrate in Embodiment 1 for each relevant item is shown in Table 5 below.

In the second display substrate of Comparison 1, for the red light-emitting device, a driving voltage is 4.0 V, luminous brightness is 3,000 nits, color coordinates are (0.552, 0.446), and luminous efficiency is 40 cd/A; for the green light-emitting device, a driving voltage is 3.7 V, luminous brightness is 10,000 nits, color coordinates are (0.340, 0.599), luminous efficiency is 55 cd/A.

TABLE 5

| Item | Light-Emitting Device Type | Voltage | Brightness (nits) | Color Coordinates | Efficiency | Lifetime LT95 |
|---|---|---|---|---|---|---|
| Comparison | Red | 100% | 3000 | 0.67, 0.330 | 100% | 100% |
| 1 | Green | 100% | 10000 | 0.20, 0.75 | 100% | 100% |
| | Blue | 100% | 1000 | 0.138, 0.043 | 100% | 100% |

TABLE 5-continued

| Item | Light-Emitting Device Type | Voltage | Brightness (nits) | Color Coordinates | Efficiency | Lifetime LT95 |
|---|---|---|---|---|---|---|
| Embodiment 1 | Red | 190% | 3000 | 0.670, 0.330 | 450% | 210% |
| | Green | 195% | 10000 | 0.197, 0.763 | 370% | 230% |
| | Blue | 200% | 1000 | 0.138, 0.046 | 180% | 160% |

In Embodiment 1, the second light-emitting layer 25 in the light-emitting device is combined with the first light-emitting layer 23 in a tandem manner. As can be seen from the above results, both the red and green light-emitting devices of Embodiment 1 exhibit several-fold enhancement of lifetime under the same brightness and several-fold enhancement of efficiency, compared to light-emitting devices of corresponding colors in the first display substrate in Comparison 1. In Embodiment 1, the second light-emitting layer 25 and the first light-emitting layer 23 have the same component composition, forming a tandem structure, so that the lifetime under the same brightness and the efficiency are also significantly improved relative to the blue light-emitting device in the second display substrate.

Verification Example 2, which Includes Embodiment 2-1, Embodiment 2-2, and Embodiment 2-3

In addition to the red sub-micro cavity adjustment layer further includes a red electron blocking layer, and the green sub-micro cavity adjustment layer further includes a green electron blocking layer, the display substrates 100 of Embodiment 2-1, Embodiment 2-2, and Embodiment 2-3 each have the same film layer structure and the same film layer materials as that of the display substrate 100 of Embodiment 1.

The thickness of each film layer corresponding to the light-emitting devices in the display substrate in Embodiment 2-1 is shown in Table 6 below.

TABLE 6

| Item | R Light-Emitting Device | G Light-Emitting Device | B Light-Emitting Device |
|---|---|---|---|
| Thickness Of Anode Layer (nm) | 100 | 100 | 100 |
| Thickness Of Light-Transmitting Conductive Layer (nm) | 8 | 8 | 8 |
| Thickness Of Hole Injection Layer (nm) | 10 | 10 | 10 |
| Thickness Of First Hole Transport Layer (nm) | 20 | 20 | 20 |
| Thickness Of Second Microcavity Adjustment Layer (nm) | 5 | 5 | 5 |
| Thickness Of First Light-Emitting Layer (nm) | 20 | 20 | 20 |
| Thickness Of First Hole Blocking Layer (nm) | 8 | 8 | 8 |
| Thickness Of First Electron Transport Layer (nm) | 10 | 10 | 10 |
| Thickness Of First Charge Generating Layer (nm) | 8 | 8 | 8 |
| Thickness Of Second Charge Generating Layer (nm) | 10 | 10 | 10 |
| Thickness Of Second Hole Transport Layer (nm) | 39 | 39 | 39 |
| Thickness Of Sub-Microcavity Adjustment Layer Of Each Color (nm) | 10 | 10 | 15 |
| Thickness Of Electron Blocking Layer Of Each Color (nm) | 5 | 5 | Null |

TABLE 6-continued

| Item | R Light-Emitting Device | G Light-Emitting Device | B Light-Emitting Device |
|---|---|---|---|
| Thickness Of Second Light-Emitting Layer (nm) | 20 | 20 | 20 |
| Thickness Of Second Hole Blocking Layer (nm) | 5 | 5 | 5 |
| Thickness Of Second Electron Transport Layer (nm) | 35 | 35 | 35 |
| Thickness Of Electron Injection Layer (nm) | 1 | 1 | 1 |
| Thickness Of Cathode Layer (nm) | 15 | 15 | 15 |

The thickness of each film layer corresponding to the light-emitting devices in the display substrate in Embodiment 2-2 is shown in Table 7 below.

TABLE 7

| Item | R Light-Emitting Device | G Light-Emitting Device | B Light-Emitting Device |
|---|---|---|---|
| Thickness Of Anode Layer (nm) | 100 | 100 | 100 |
| Thickness Of Light-Transmitting Conductive Layer (nm) | 8 | 8 | 8 |
| Thickness Of Hole Injection Layer (nm) | 10 | 10 | 10 |
| Thickness Of First Hole Transport Layer (nm) | 30 | 30 | 30 |
| Thickness Of Second Microcavity Adjustment Layer (nm) | 5 | 5 | 5 |
| Thickness Of First Light-Emitting Layer (nm) | 20 | 20 | 20 |
| Thickness Of First Hole Blocking Layer (nm) | 8 | 8 | 8 |
| Thickness Of First Electron Transport Layer (nm) | 10 | 10 | 10 |
| Thickness Of First Charge Generating Layer (nm) | 8 | 8 | 8 |
| Thickness Of Second Charge Generating Layer (nm) | 10 | 10 | 10 |
| Thickness Of Second Hole Transport Layer (nm) | 29 | 29 | 29 |
| Thickness Of Sub-Microcavity Adjustment Layer Of Each Color (nm) | 10 | 10 | 15 |
| Thickness Of Electron Blocking Layer Of Each Color (nm) | 5 | 5 | Null |
| Thickness Of Second Light-Emitting Layer (nm) | 20 | 20 | 20 |
| Thickness Of Second Hole Blocking Layer (nm) | 5 | 5 | 5 |
| Thickness Of Second Electron Transport Layer (nm) | 35 | 35 | 35 |
| Thickness Of Electron Injection Layer (nm) | 1 | 1 | 1 |
| Thickness Of Cathode Layer (nm) | 15 | 15 | 15 |

The thickness of each film layer corresponding to the light-emitting devices in the display substrate in Embodiment 2-3 is shown in Table 8 below.

TABLE 8

| Item | R Light-Emitting Device | G Light-Emitting Device | B Light-Emitting Device |
|---|---|---|---|
| Thickness Of Anode Layer (nm) | 100 | 100 | 100 |
| Thickness Of Light-Transmitting Conductive Layer (nm) | 8 | 8 | 8 |
| Thickness Of Hole Injection Layer (nm) | 10 | 10 | 10 |
| Thickness Of First Hole Transport Layer (nm) | 40 | 40 | 40 |
| Thickness Of Second Microcavity Adjustment Layer (nm) | 5 | 5 | 5 |
| Thickness Of First Light-Emitting Layer (nm) | 20 | 20 | 20 |
| Thickness Of First Hole Blocking Layer (nm) | 8 | 8 | 8 |
| Thickness Of First Electron Transport Layer (nm) | 10 | 10 | 10 |
| Thickness Of First Charge Generating Layer (nm) | 8 | 8 | 8 |
| Thickness Of Second Charge Generating Layer (nm) | 10 | 10 | 10 |
| Thickness Of Second Hole Transport Layer (nm) | 19 | 19 | 19 |
| Thickness Of Sub-Microcavity Adjustment Layer Of Each Color (nm) | 10 | 10 | 15 |

TABLE 8-continued

| Item | R Light-Emitting Device | G Light-Emitting Device | B Light-Emitting Device |
|---|---|---|---|
| Thickness Of Electron Blocking Layer Of Each Color (nm) | 5 | 5 | Null |
| Thickness Of Second Light-Emitting Layer (nm) | 20 | 20 | 20 |
| Thickness Of Second Hole Blocking Layer (nm) | 5 | 5 | 5 |
| Thickness Of Second Electron Transport Layer (nm) | 35 | 35 | 35 |
| Thickness Of Electron Injection Layer (nm) | 1 | 1 | 1 |
| Thickness Of Cathode Layer (nm) | 15 | 15 | 15 |

In the above three embodiments, the magnitude of $L_1$ is adjusted by varying the thickness of the first hole transport layer relatively close to the anode layer, and lengths of sub-microcavities of respective light-emitting devices of the same color are kept consistent by adjusting the thicknesses of corresponding second hole transport layers relatively far away from the anode layer.

The light-emitting parameters of each type of light-emitting device in Embodiment 2-1, Embodiment 2-2, and Embodiment 2-3 are shown in Table 9 below.

TABLE 9

| Item | Light-Emitting Device Color | Voltage | Brightness (nits) | Color Coordinates | Efficiency | Lifetime | $L_1 - L_2$ (k = 1) |
|---|---|---|---|---|---|---|---|
| Implementation 2-1 | Red | 100% | 5000 | 0.687, 0.313 | 100% | 100% | 14.8 nm |
| | Green | 100% | 15000 | 0.275, 0.699 | 100% | 100% | |
| | Blue | 100% | 1000 | 0.145, 0.042 | 100% | 100% | |
| Implementation 2-2 | Red | 99% | 5000 | 0.686, 0.313 | 102% | 100% | 33.3 nm |
| | Green | 101% | 15000 | 0.273, 0.701 | 99% | 99% | |
| | Blue | 99% | 1000 | 0.141, 0.048 | 92% | 101% | |
| Implementation 2-3 | Red | 101% | 5000 | 0.688, 0.313 | 98% | 100% | 51.8 nm |
| | Green | 100% | 15000 | 0.276, 0.698 | 100% | 100% | |
| | Blue | 100% | 1000 | 0.138, 0.055 | 85% | 101% | |

As can be seen from the above results, it can be seen from the comparison that in a case where the thickness of the first hole transport layer relatively close to the anode layer is continuously increasing, the overall properties of the red light-emitting device and the green light-emitting device change less significantly, but the efficiency of the blue light-emitting device decreases significantly, and at the same time the color purity is also significantly reduced.

Figure 13:
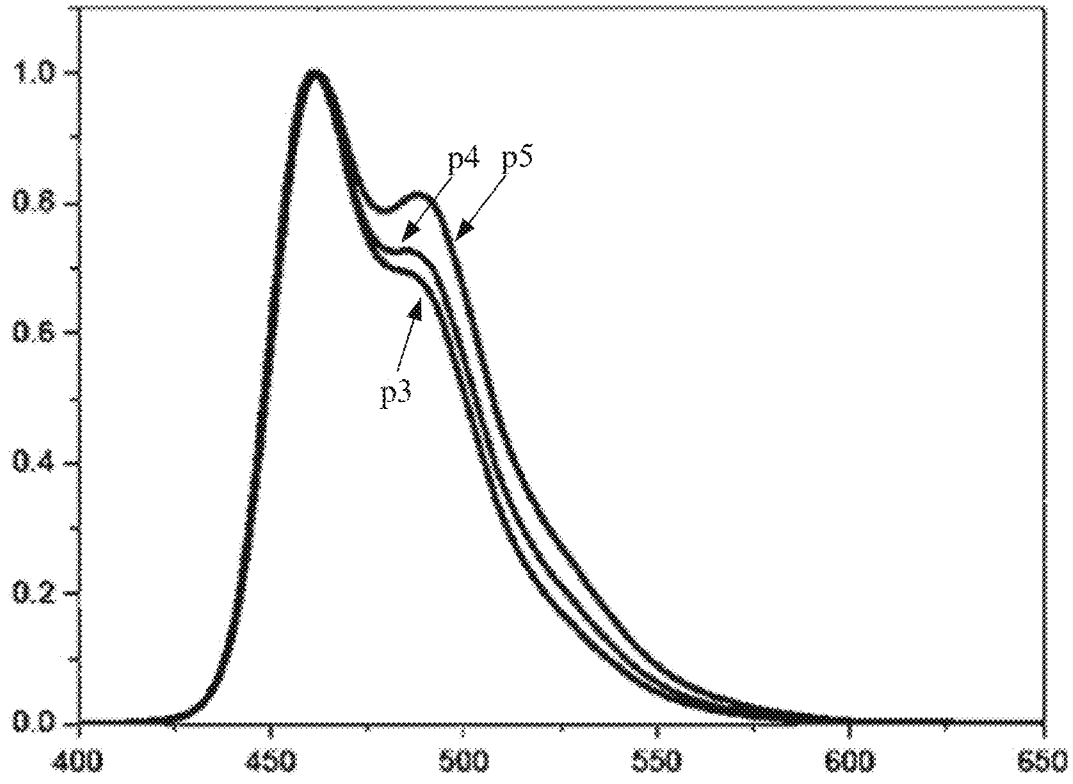
FIG. 13 is a diagram showing spectrum of blue light-emitting devices in Validation Example 2.

As shown in FIG. 13, the spectra of the blue light-emitting devices of Embodiment 2-1, Embodiment 2-2, and Embodiment 2-3 are marked as p3, p4, and p5, respectively. Furthermore, by carrying out corresponding bottom-emission experimental observation, it can be seen that, in a case where the thickness of the first hole transport layer is continuously increased, the emission spectrum of the blue light-emitting device is continuously broadened and appears an obvious double-peak structure. This change in the spectrum is clearly correlated with the decrease in the luminous efficiency and color purity of the top-emitting device.

The luminous efficiency of the blue light-emitting device in the display substrate in Embodiment 2-3 is too low (less than 90%), and a corresponding value $|L_1-L_2|=51.8$ nm does not meet the formula $|L_1-L_2|\leq 37$ nm in the present disclosure (a corresponding $\bar{n}=1.85$ at the target wavelength of the blue light), and is determined to be unqualified.

The foregoing description is only specific embodiments of the present disclosure, but the scope of protection of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:

a backplate;

an anode layer, a first auxiliary layer, a second auxiliary layer, a third auxiliary layer, and a cathode layer that are stacked on the backplate in sequence, with a microcavity formed between the anode layer and the cathode layer;

a plurality of first light-emitting layers of at least two different colors provided between the first auxiliary layer and the second auxiliary layer, wherein the plurality of first light-emitting layers at least include a plurality of first blue light-emitting layers; and a plurality of second light-emitting layers of at least two different colors provided between the second auxiliary layer and the third auxiliary layer, wherein the plurality of second light-emitting layers at least include a plurality of second blue light-emitting layers;

wherein the first auxiliary layer includes film layers stacked in sequence, a number of the film layers is a; and a portion, opposite to a first blue light-emitting layer, of the film layers with the number of a has an optical thickness of $L_1$, and $L_1$ satisfies:

$$L_1 = \sum_{h=1}^{a} n_h r_h;$$

wherein a is a positive integer, $n_h$ is a refractive index of an h-th film layer among the film layers with the number of a, and $r_h$ is a thickness of the h-th film layer;

the third auxiliary layer includes film layers stacked in sequence, a number of the film layers is b; and a portion, opposite to the first blue light-emitting layer, of the film layers with the number of b has an optical thickness of $L_2$, and $L_2$ satisfies:

$$L_2 = \sum_{i=1}^{b} n_i r_i;$$

wherein b is a positive integer, $n_i$ is a refractive index of an i-th film layer among the film layers with the number of b, and $r_i$ is a thickness of the i-th film layer; and $L_1$ and $L_2$ satisfy a following formula:

$$|L_1 - L_2| \leq 20\bar{n} + \frac{(k-1)\lambda_B}{2^{k-1}};$$

wherein $\bar{n}$ is an average refractive index of film layers located between the first auxiliary layer and the third auxiliary layer and opposite to the first blue light-emitting layer to a center wavelength of blue light, $\lambda_B$ is a wavelength at a target spectrum peak of the blue light, and k is a positive integer.

2. The display substrate according to claim 1, wherein the plurality of first light-emitting layers further include a plurality of first red light-emitting layers and a plurality of first green light-emitting layers;

wherein a first red light-emitting layer and the first blue light-emitting layer have different thicknesses, and/or a first green light-emitting layer and the first blue light-emitting layer have different thicknesses.

3. The display substrate according to claim 2, wherein the plurality of second light-emitting layers further include a plurality of second red light-emitting layers and a plurality of second green light-emitting layers;

wherein a second red light-emitting layer and the second blue light-emitting layer have different thicknesses, and/or a second green light-emitting layer and the second blue light-emitting layer have different thicknesses.

4. The display substrate according to claim 3, wherein the second auxiliary layer includes a first microcavity adjustment layer;

wherein of the first microcavity adjustment layer, a portion opposite to the second red light-emitting layer and a portion opposite to the second blue light-emitting layer have different thicknesses; and/or of the first microcavity adjustment layer, a portion opposite to the second green light-emitting layer and the portion opposite to the second blue light-emitting layer have different thicknesses.

5. The display substrate according to claim 4, wherein the first microcavity adjustment layer includes:

a second hole transport layer;

first red sub-microcavity adjustment layers, a first red sub-microcavity adjustment layer being provided between the second hole transport layer and the second red light-emitting layer;

first green sub-microcavity adjustment layers, a first green sub-microcavity adjustment layer being provided between the second hole transport layer and the second green light-emitting layer; and first blue sub-microcavity adjustment layers, a first blue sub-microcavity adjustment layer being provided between the second hole transport layer and the second blue light-emitting layer;

wherein the first red sub-microcavity adjustment layer and the first blue sub-microcavity adjustment layer have different thicknesses, and/or the first green sub-microcavity adjustment layer and the first blue sub-microcavity adjustment layer have different thicknesses.

6. The display substrate according to claim 5, wherein the first red sub-microcavity adjustment layer includes a red hole transport layer and a red electron blocking layer that are stacked in sequence along a direction away from the backplate, and the first green sub-microcavity adjustment layer includes a green hole transport layer and a green electron blocking layer that are stacked in sequence along the direction away from the backplate;

wherein the red hole transport layer and the green hole transport layer are each used to adjust a length of a corresponding sub-microcavity in the microcavity.

7. The display substrate according to claim 3, wherein at least for a first light-emitting layer of one color, a wavelength of light emitted by the first light-emitting layer is less than a wavelength of light emitted by a second light-emitting layer of a same color.

8. The display substrate according to claim 3, wherein the first light-emitting layers each contain a first guest material, and the second light-emitting layers each contain a second guest material; and at least for a first light-emitting layer of one color, an emission spectrum of a first guest material of the first light-emitting layer at least partially overlaps with an absorption spectrum of a second guest material of a second light-emitting layer of a same color.

9. The display substrate according to claim 8, wherein an overlapping range of the emission spectrum of the first guest material and the absorption spectrum of the second guest material is greater than or equal to 60% of a wavelength range of the emission spectrum of the first guest material; or the overlapping range of the emission spectrum of the first guest material and the absorption spectrum of the second guest material is greater than or equal to 60% of a wavelength of the absorption spectrum of the second guest material.

10. The display substrate according to claim 8, wherein a peak of an emission spectrum of a first guest material of the first red light-emitting layer is in a range of 560 nm to 570 nm, inclusive; and a peak of an absorption spectrum of a second guest material of the second red light-emitting layer is in a range of 595 nm to 605 nm, inclusive; and/or wherein a peak of an emission spectrum of a first guest material of the first green light-emitting layer is in a range of 500 nm to 510 nm, inclusive; and a peak of an absorption spectrum of a second guest material of the second green light-emitting layer is in a range of 515 nm to 525 nm, inclusive.

11. The display substrate according to claim 8, wherein at least for a first light-emitting layer of one color, a first guest material of the first light-emitting layer includes at least one luminescent material;

in a case where the first guest material includes two luminescent materials, a distance between peaks of emission spectra of the two luminescent materials is less than or equal to 30 nm, or the distance between the peaks of the emission spectra of the two luminescent materials is less than or equal to 30 nm, and at least one of the two luminescent materials is doped with boron element, with a doping radio of the boron element being in a range of 0.5% to 5%, inclusive.

12. The display substrate according to claim 8, wherein at least for a second light-emitting layer of one color, a second guest material of the second light-emitting layer includes at least one luminescent material;

in a case where the second guest material includes two luminescent materials, a distance between peaks of emission spectra of the two luminescent materials is less than or equal to 30 nm, or the distance between the peaks of the emission spectra of the two luminescent materials is less than or equal to 30 mm, and at least one of the two luminescent materials is doped with boron element, with a doping ratio of the boron element being in a range of 0.5% to 5%, inclusive.

13. The display substrate according to claim 8, wherein the first guest material includes at least one of a fluorescent-like material, a phosphorescent-like material, and a thermally activated delayed fluorescence material; and/or the second guest material includes at least one of a fluorescent-like material, a phosphorescent-like material, and a thermally activated delayed fluorescence material having multiple resonance property.

14. The display substrate according to claim 8, wherein the first light-emitting layer further contains a first host material, and the first host material is a single host material or a P-type and N-type hybrid host material; and the second light-emitting layer further contains a second host material, and the second host material contains a bipolar host material.

15. The display substrate according to claim 14, wherein the bipolar host material is a single host material or a P-type and N-type hybrid host material;

in a case where the second host material is the P-type and N-type hybrid host material, an N-type component of the host material has thermally activated delayed fluorescence property.

16. The display substrate according to claim 2, wherein the first auxiliary layer includes:

a light-transmitting conductive layer, a hole injection layer and a second microcavity adjustment layer that are stacked in sequence along a direction away from the backplate, wherein the second microcavity adjustment layer includes:

a first hole transport layer;

second red sub-microcavity adjustment layers, a second red sub-microcavity adjustment layer being provided between the first hole transport layer and the first red light-emitting layer;

second green sub-microcavity adjustment layers, a second green sub-microcavity adjustment layer being provided between the first hole transport layer and the first green light-emitting layer; and second blue sub-microcavity adjustment layers, a second blue sub-microcavity adjustment layer being provided between the first hole transport layer and the first blue light-emitting layer:

or the second microcavity adjustment layer includes:

a first hole transport layer and an electron blocking layer that are stacked in sequence along the direction away from the backplate;

or the second microcavity adjustment layer includes:

a first hole transport layer;

a second blue sub-microcavity adjustment layer provided on a side of the first bole transport layer away from the backplate;

second red sub-microcavity adjustment layers, a second red sub-microcavity adjustment layer being provide between the second blue sub-microcavity adjustment layer and the first red light-emitting layer; and second green sub-microcavity adjustment layers, a second green sub-microcavity adjustment layer being provided between the second blue sub-microcavity adjustment layer and the first green light-emitting layer.

17. The display substrate according to claim 2, wherein the microcavity includes a plurality of sub-microcavities, and the plurality of sub-microcavities include red sub-microcavities corresponding to the first red light-emitting layers, green sub-microcavities corresponding to the first green light-emitting layers, and blue sub-microcavities corresponding to the first blue light-emitting layers;

wherein film layers that are located between the anode layer and the cathode layer, and correspond to a sub-microcavity of any one color are in a number of c, the film layers with the number of c have an optical thickness of $L_3$, and $L_3$ satisfies:

$$L_3 = \sum_{j=1}^{c} n_j r_j;$$

wherein c is a positive integer, $n_j$ is a refractive index of a j-th film layer among the film layers with the number of c, and $r_j$ is a thickness of the j-th film layer; and the sub-microcavity of any one color satisfies:

$$2L_3 + \frac{\varphi}{2_\pi}\lambda = m\lambda;$$

wherein m is a natural number, λ is an interference wavelength, and φ is a phase shift caused by the anode layer.

18. The display substrate according to claim 17, wherein a length of a blue sub-microcavity is less than a length of a red sub-microcavity; and a length of the blue sub-microcavity is less than a length of a green sub-microcavity.

19. The display substrate according to claim 1, wherein the second auxiliary layer is plural in number, and any two adjacent second auxiliary layers are provided therebetween with a plurality of first light-emitting layers of at least two different colors or a plurality of second light-emitting layers of at least two different colors.

20. A display apparatus, comprising the display substrate according to claim 1.

* * * * *